United States Patent
Ulupinar et al.

(10) Patent No.: US 9,198,112 B2
(45) Date of Patent: Nov. 24, 2015

(54) DEVICE MOBILITY FOR SPLIT-CELL RELAY NETWORKS

(71) Applicant: QUALCOMM Incorporated, San Diego, CA (US)

(72) Inventors: Fatih Ulupinar, San Diego, CA (US); Yongsheng Shi, Falls Church, VA (US); Gavin B. Horn, La Jolla, CA (US); Parag Arun Agashe, San Diego, CA (US); Xiaolong Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 151 days.

(21) Appl. No.: 14/023,164

(22) Filed: Sep. 10, 2013

(65) Prior Publication Data

US 2014/0016542 A1    Jan. 16, 2014

Related U.S. Application Data

(62) Division of application No. 12/752,975, filed on Apr. 1, 2010, now Pat. No. 8,532,056.

(60) Provisional application No. 61/168,737, filed on Apr. 13, 2009.

(51) Int. Cl.
*H04W 40/36*     (2009.01)
*H04B 7/26*      (2006.01)
(Continued)

(52) U.S. Cl.
CPC ............ *H04W 40/36* (2013.01); *H04B 7/2606* (2013.01); *H04W 76/022* (2013.01);
(Continued)

(58) Field of Classification Search
CPC ... H04W 40/36; H04W 92/20; H04W 76/022; H04W 92/04; H04W 28/065; H04W 84/047; H04B 7/2606; H01L 2924/00013
See application file for complete search history.

(56) References Cited

U.S. PATENT DOCUMENTS 8,094,622 B2 *   1/2012   Tamura .................... 370/331
8,532,056 B2     9/2013   Ulupinar et al.
(Continued)

FOREIGN PATENT DOCUMENTS

CN    101365168 A    2/2009
EP    1569388 A1    8/2005
(Continued)

OTHER PUBLICATIONS

3GPP: "3rd Generation Partnership Project; Technical Specification Group Radio Access Network; Home (e)NodeB; Network aspects(Release 8)" 3GPP Draft; R3-083410_R3.020_V0.9.1_Clean_V2, 3rd Generation Partnership Project (3GPP), Mobile Competence Centre; 650, Route Des Lucioles; F-06921 Sophia-Antipolis Cedex; France, no. Prague, Czech Republic; 20081117, Nov. 17, 2008, XP050324621, p. 55; figures 6.2.1.2.3-1, p. 51-p. 63.
(Continued)

*Primary Examiner* — Chi H Pham
*Assistant Examiner* — Weibin Huang
(74) *Attorney, Agent, or Firm* — Ke Liu

(57) ABSTRACT

Systems and methodologies are described that facilitate supporting mobility for UEs and relay eNBs in split-cell relay configurations. Parameters regarding communicating with one or more UEs can be provided to disparate eNBs from a donor eNB to provide mobility for one or more of the UEs or a serving relay eNB. In addition, a donor eNB can request establishment of one or more radio bearers at a target relay eNB for continuing communications with one or more UEs. Moreover, a donor eNB can provide information regarding one or more core network bearers to a target donor eNB to facilitate establishing the core network bearers at the target donor eNB for communicating with the one or more UEs. Furthermore, uplink buffer contents from a relay eNB can be provided to a target donor eNB so communications from the one or more UEs can be continued by the target donor eNB.

23 Claims, 22 Drawing Sheets

(51) Int. Cl.
  H04W 76/02    (2009.01)
  H04W 92/20    (2009.01)
  H04W 28/06    (2009.01)
  H04W 84/04    (2009.01)
  H04W 92/04    (2009.01)

(52) U.S. Cl.
  CPC .... *H04W 92/20* (2013.01); *H01L 2924/00013* (2013.01); *H04W 28/065* (2013.01); *H04W 84/047* (2013.01); *H04W 92/04* (2013.01)

(56) References Cited

U.S. PATENT DOCUMENTS

| | | |
|---|---|---|
| 2006/0003696 A1 | 1/2006 | Diaz Cervera et al. |
| 2007/0237107 A1 | 10/2007 | Jang et al. |
| 2008/0043666 A1 | 2/2008 | Tamura et al. |
| 2008/0045217 A1* | 2/2008 | Kojima ............... 455/436 |
| 2008/0130549 A1 | 6/2008 | Chindapol et al. |
| 2008/0192700 A1 | 8/2008 | Lee et al. |
| 2008/0219203 A1 | 9/2008 | Chou et al. |
| 2008/0233963 A1* | 9/2008 | Alanara et al. ......... 455/438 |
| 2008/0247389 A1 | 10/2008 | Horn |
| 2008/0285501 A1 | 11/2008 | Zhang et al. |
| 2008/0310367 A1 | 12/2008 | Meylan |
| 2008/0310452 A1 | 12/2008 | Vedantham et al. |
| 2009/0040982 A1 | 2/2009 | Ho et al. |
| 2009/0046661 A1 | 2/2009 | Casati et al. |
| 2009/0190521 A1 | 7/2009 | Horn et al. |
| 2009/0245201 A1 | 10/2009 | Motegi et al. |
| 2010/0150022 A1 | 6/2010 | Cai et al. |
| 2010/0215020 A1 | 8/2010 | Lee et al. |
| 2010/0260096 A1 | 10/2010 | Ulupinar et al. |
| 2010/0260126 A1 | 10/2010 | Ulupinar et al. |
| 2010/0272007 A1 | 10/2010 | Shen et al. |
| 2010/0284278 A1 | 11/2010 | Alanara |
| 2010/0323700 A1* | 12/2010 | Bachmann et al. ......... 455/436 |
| 2011/0280127 A1* | 11/2011 | Raaf et al. .............. 370/230 |
| 2012/0039240 A1 | 2/2012 | Han et al. |
| 2012/0051349 A1* | 3/2012 | Teyeb et al. ............. 370/338 |

FOREIGN PATENT DOCUMENTS

| | | |
|---|---|---|
| EP | 1921807 A1 | 5/2008 |
| EP | 1978709 | 10/2008 |
| KR | 20080075310 A | 8/2008 |
| WO | 2006018670 A1 | 2/2006 |
| WO | 2007019672 | 2/2007 |
| WO | 2007119168 A2 | 10/2007 |
| WO | 2008115447 A2 | 9/2008 |
| WO | 2009106615 A1 | 9/2009 |
| WO | 2009139679 A1 | 11/2009 |

OTHER PUBLICATIONS

3GPP TS 36.413 v9 I O, "Evolved Universal Terrestrial Radio Access Network (E-UTRAN);" S1 Application Protocol (S1AP), Release 9 Dec. 2009.

3rd Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 8) 3GPP Standard; 3GPP TS 36.300, 3rd Generation Partnership Project (3GPP), Mobile Competence Centre; 650, Route Des Lucioles; F-06921 Sophia-Antipolis Cedex; France, No. V8.8.0, Mar. 1, 2009, pp. 1-157, XP050377583, p. 45, line 3—p. 50, line 15.

3rd Generation Partnership Project; Technical Specification Group Radio Access Network; Evolved Universal Terrestrial Radio Access (E-UTRA); Packet Data Convergence Protocol (PDCP) specification (Release 8) 3GPP Standard; 3GPP TS 36.323, 3rd Generation Partnership Project (3GPP), Mobile Competence Centre; 650, Route Des Lucioles; F-06921 Sophia-Antipolis Cedex; France, No. V8.1.0, Mar. 1, 2008, pp. 1-28, XP050377637, Chapter 5.5.1, Chapter 6.1.2.

"3rd Generation Partnership Project; Technical Specification Group Radio Access Network; Evolved Universal Terrestrial Radio Access (E-UTRA) Radio Resource Control (RRC); Protocol specification (Release 8)" 3GPP Standard; 3GPP TS 36.331, 3rd Generation Partnership Project (3GPP), Mobile Competence Centre; 650, Route Des Lucioles; F-06921 Sophia-Antipolis Cedex; France, No. V8.4.0, Dec. 1, 2008, pp. 1-198, XP050377647, paragraph [5.2.2.5] paragraph [6.2.2].

3rd Generation Partnership Project; Technical Specification Group Radio Access Network; Evolved Universal Terrestrial Radio Access (E-UTRA); Relay architectures for E-UTRA (LTE-Advanced) (Release 9), 3GPP Draft; R2-095391 TR 36.806 V0.1.0 on Relay Architectures for E-UTRA, 3rd Generation Partnership Project (3GPP); France, no. Miyazki; 20091012, Sep. 1, 2009, XP050389991, paragraph 4, subparagraphs 4.2.1, 4.2.2, 4.2.3, subparagraphs 54.2.3.1, 4.2.3.2, figures 4.2.3.1-1 and 4.2.3.1-s, figures 4.2.3.2-1 and 4.2.3.2-2.

3rd Generation Partnership Project; Technical Specification Group Radio Access Network; Evolved Universal Terrestrial Radio Access Network (E-UTRAN); S1 Application Protocol (S1AP) (Release 8) 3GPP Standard; 3GPP TS 36.413, 3rd Generation Partnership Project (3GPP), Mobile Competence Centre; 650, Route Des Lucioles; F-06921 Sophia-Antipolis Cedex; France, No. V8.5.1, Mar. 1, 2009, pp. 1-215, XP050377695.

Email Discussion Rapporteur (NTT Docomo et al: 3GPP Draft; R2-093972, 3rd Generation Partnership Project (3GPP), Mobile Competence Centre ; 650, Route Des Lucioles ; F-06921 Sophia-Antipolis Cedex ; France, no. Los Angeles, USA; 20090623, Jun. 23, 2009, XP050352150.

Ericsson: "Overview of relaying options", R2-092081, 3GPP TSG-RAN WG2 #65bis, Mar. 27, 2009.

Huawei: "Consideration for Relay" 3GPP Draft; R2-092179 Consideration for Relay, 3rd Generation Partnership Project (3GPP), Mobile Competence Centre ; 650, Route Des Lucioles ; F-06921 Sophia-Antipolis Cedex ; France, no. Seoul, Korea; 20090317, Mar. 17, 2009, XP050340009.

Institute for Information Industry (III) et al: "Multi-hop type-I Relay" 3GPP Draft; R3-091634_Multi-Hop_Type-I_Relay, 3rd Generation Partnership Project (3GPP), Mobile Competence Centre ; 650, Route Des Lucioles ; F-06921 Sophia-Antipolis Cedex ; France, no. Shenzhen/ China; 20090820, Aug. 20, 2009, XP050353027.

International Search Report and Written Opinion—PCTAJS2010/030949, International Search Authority—European Patent Office—Jul. 19, 2010.

International Search Report and Written Opinion—PCT/US2010/030947, International Search Authority—European Patent Office—Jul. 15, 2010.

International Search Report and Written Opinion—PCT/US2010/030948, International Search Authority—European Patent Office—Jul. 15, 2010.

Motorola: "Flow Control" 3GPP Draft; R2-073540, 3rd Generation Partnership Project (3GPP), Mobile Competence Centre ; 650, Route Des Lucioles ; F-06921 Sophia-Antipolis Cedex ; France, vol. RAN WG2, no. Athens, Greece; 20070817, Aug. 17, 2007, XP050136235.

Qualcomm Europe: "Preference for Relay Operation in LTE-A", R1-090876, 3GPP TSG-RAN WG1 #56, Feb. 13, 2009.

Qualcomm Europe: "Preference for Relay Operation in LTE-A", R1-091049, 3GPP TSG-RAN WG1 #56, Feb. 13, 2009.

Qualcomm Europe: "Preference for Relay Operation in LTE-A", R2-092153, 3GPP TSG-RAN WG2 #65bis, Mar. 27, 2009.

Qualcomm Europe: "Preference for Relay Operation in LTE-A", R3-090702, 3GPP TSG-RAN WG3 #63bis, Mar. 27, 2009.

Research in Motion UK Limited: "Joint PDCP protocols on Uu and Un interfaces to improve type-I relay handover" 3GPP Draft; R2-093735, 3rd Generation Partnership Project (3GPP), Mobile Competence Centre ; 650, Route Des Lucioles ; F-06921 Sophia-Antipolis Cedex ; France, no. Los Angeles, USA; 20090622, Jun. 22, 2009, XP050351968.

Texas Instruments: "Minimizing the Type I RN complexity in LTE-A" 3GPP Draft; R2-093787, 3rd Generation Partnership Project (3GPP), Mobile Competence Centre ; 650, Route Des Lucioles ; F-06921 Sophia-Antipolis Cedex ; France, no. Los Angeles, USA; 20090623, Jun. 23, 2009, XP050352008.

(56) References Cited

OTHER PUBLICATIONS

Texas Instruments: "On the design of relay node for LTE-advanced" 3GPP Draft; R1-090593, 3rd Generation Partnership Project (3GPP), Mobile Competence Centre ; 650, Route Des Lucioles ; F-06921 Sophia-Antipolis Cedex ; France, no. Athens, Greece; 20090203, Feb. 3, 2009, XP050318480.

Texas Instruments: "On the design of relay node for LTE-advanced", R1-090290, 3GPP TSG RAN WG1 #55bis, Jan. 16, 2009.

* cited by examiner

DEVICE MOBILITY FOR SPLIT-CELL RELAY NETWORKS

CROSS REFERENCE TO RELATED APPLICATIONS

This application is a divisional of U.S. patent application Ser. No. 12/752,975, filed Apr. 1, 2010, entitled "DEVICE MOBILITY FOR SPLIT-CELL RELAY NETWORKS", which in turn claims priority to Provisional Application No. 61/168,737 entitled "SPLIT-CELL BASED RELAY FOR LTE" filed Apr. 13, 2009. The entireties of the aforementioned applications are incorporated herein by reference.

BACKGROUND

1. Field

The following description relates generally to wireless communications, and more particularly to routing data packets among multiple access points.

2. Background

Wireless communication systems are widely deployed to provide various types of communication content such as, for example, voice, data, and so on. Typical wireless communication systems may be multiple-access systems capable of supporting communication with multiple users by sharing available system resources (e.g., bandwidth, transmit power, . . . ). Examples of such multiple-access systems may include code division multiple access (CDMA) systems, time division multiple access (TDMA) systems, frequency division multiple access (FDMA) systems, orthogonal frequency division multiple access (OFDMA) systems, and the like. Additionally, the systems can conform to specifications such as third generation partnership project (3GPP), 3GPP long term evolution (LTE), ultra mobile broadband (UMB), and/or multi-carrier wireless specifications such as evolution data optimized (EV-DO), one or more revisions thereof, etc.

Generally, wireless multiple-access communication systems may simultaneously support communication for multiple mobile devices. Each mobile device may communicate with one or more access points (e.g., base stations) via transmissions on forward and reverse links. The forward link (or downlink) refers to the communication link from access points to mobile devices, and the reverse link (or uplink) refers to the communication link from mobile devices to access points. Further, communications between mobile devices and access points may be established via single-input single-output (SISO) systems, multiple-input single-output (MISO) systems, multiple-input multiple-output (MIMO) systems, and so forth. Access points, however, can be limited in geographic coverage area as well as resources such that mobile devices near edges of coverage and/or devices in areas of high traffic can experience degraded quality of communications from an access point.

Cell relays can be provided to expand network capacity and coverage area by facilitating communication between mobile devices and access points. For example, a cell relay can establish a backhaul link with a donor access point, which can provide access to a number of cell relays, and the cell relay can establish an access link with one or more mobile devices or additional cell relays. To mitigate modification to backend core network components, communication interfaces with the backend network components, such as S1-U, can terminate at the donor access point. Thus, the donor access point appears as a normal access point to backend network components. To this end, the donor access point can route packets from the backend network components to the cell relays for communicating to the mobile devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with one or more aspects and corresponding disclosure thereof, various aspects are described in connection with providing UE and relay eNB mobility in split-cell relay implementations. For example, a relay eNB serving a UE can maintain one or more parameters related to providing data to the UE from an upstream node (and/or vice versa). In addition, a donor eNB serving the relay eNB can further maintain one or more parameters regarding communicating with the UE through the relay eNB. To facilitate handing over the UE to a target eNB, the donor eNB can provide its one or more parameters to the target eNB where served by the donor eNB in an intra-cluster handover. In addition, relay eNB can provide its one or more parameters to the donor eNB for provisioning to the target eNB where the target eNB is served by a target donor eNB in an inter-cluster handover. In either case, the target eNB can continue communicating with the UE following handover based on the one or more parameters of the donor eNB and/or the relay eNB.

In addition, the donor eNB can provide its one or more parameters regarding communicating with the UE to the target relay eNB through the target donor eNB (and/or additionally to a core network that communicates with the target donor eNB). In another example, the relay eNB can handover from donor eNB to target donor eNB. In this example, donor eNB can similarly provide one or more parameters regarding communicating with substantially all UEs served by relay eNB to the target donor eNB.

According to related aspects, a method is provided that includes obtaining sequence numbers from a header of one or more packets routed from a donor eNB to a UE and requesting a handover procedure with the donor eNB. The method also includes transmitting at least one of the sequence numbers to the donor eNB as part of the handover procedure, wherein the at least one of the sequence numbers corresponds to a last packet transmitted to the UE.

Another aspect relates to a wireless communications apparatus. The wireless communications apparatus can include at least one processor configured to receive sequence numbers from a header of one or more packets obtained from a donor eNB for transmitting to a UE and initiate a handover procedure with the donor eNB. The at least one processor is further configured to communicate at least one of the sequence numbers to the donor eNB during the handover procedure, wherein the at least one of the sequence numbers corresponds to a last packet transmitted to the UE. The wireless communications apparatus also comprises a memory coupled to the at least one processor.

Yet another aspect relates to an apparatus. The apparatus includes means for receiving sequence numbers from a header of one or more packets received from a donor eNB for transmitting to a UE and means for requesting a handover procedure with the donor eNB. The apparatus further includes means for transmitting at least one of the sequence numbers to the donor eNB as part of the handover procedure.

Still another aspect relates to a computer program product, which can have a computer-readable medium including code for causing at least one computer to receive sequence numbers from a header of one or more packets obtained from a donor eNB for transmitting to a UE. The computer-readable medium can also comprise code for causing the at least one computer to initiate a handover procedure with the donor eNB and code for causing the at least one computer to communicate at least one of the sequence numbers to the donor eNB during the handover procedure, wherein the at least one of the sequence numbers corresponds to a last packet transmitted to the UE.

Moreover, an additional aspect relates to an apparatus including a packet data convergence protocol (PDCP) header observing component that obtains sequence numbers from a header of one or more packets received from a donor eNB for transmitting to a UE and a handover processing component that requests a handover procedure with the donor eNB. The apparatus can further include a PDCP parameter providing component that transmits at least one of the sequence numbers to the donor eNB as part of the handover procedure.

According to another aspect, a method is provided that includes receiving a request from a relay eNB to initiate a handover procedure and obtaining a sequence number of a last packet transmitted to at least one UE by the relay eNB. The method further includes determining a packet having a disparate sequence number that follows the sequence number for providing to the at least one UE.

Another aspect relates to a wireless communications apparatus. The wireless communications apparatus can include at least one processor configured to obtain a request from a relay eNB to initiate a handover procedure and receive a sequence number of a last packet transmitted to at least one UE by the relay eNB. The at least one processor is further configured to discern a packet having a disparate sequence number that follows the sequence number for providing to the at least one UE. The wireless communications apparatus also comprises a memory coupled to the at least one processor.

Yet another aspect relates to an apparatus. The apparatus includes means for receiving a sequence number of a last packet transmitted to at least one UE by a relay eNB as part of a handover procedure with the relay eNB and means for determining a next packet having a disparate sequence number subsequent to the sequence number for communicating to the at least one UE.

Still another aspect relates to a computer program product, which can have a computer-readable medium including code for causing at least one computer to obtain a request from a relay eNB to initiate a handover procedure and code for causing the at least one computer to receive a sequence number of a last packet transmitted to at least one UE by the relay eNB. The computer-readable medium can also comprise code for causing the at least one computer to discern a packet having a disparate sequence number that follows the sequence number for providing to the at least one UE.

Moreover, an additional aspect relates to a PDCP parameter receiving component that obtains a sequence number of a last packet transmitted to at least one UE by a relay eNB as part of a handover procedure with the relay eNB. The apparatus can further include a PDCP context maintaining component that stores the sequence number and determines a next packet having a disparate sequence number subsequent to the sequence number for communicating to the at least one UE.

According to yet another aspect, a method is provided that includes receiving one or more parameters regarding at least one bearer to establish with a core network for communicating with a UE from a donor eNB as part of a handover procedure and establishing the at least one bearer with the core network. The method also includes receiving a packet from the core network over the at least one bearer and communicating the packet to a relay eNB for providing to the UE.

Another aspect relates to a wireless communications apparatus. The wireless communications apparatus can include at least one processor configured to obtain one or more parameters regarding at least one bearer to establish with a core network for communicating with a UE from a donor eNB as part of a handover procedure and activate the at least one bearer with the core network. The at least one processor is further configured to obtain a packet from the core network over the at least one bearer and communicate the packet to a relay eNB for providing to the UE. The wireless communications apparatus also comprises a memory coupled to the at least one processor.

Yet another aspect relates to an apparatus. The apparatus includes means for receiving one or more parameters regarding at least one bearer to establish with a core network for communicating with a UE from a donor eNB as part of a handover procedure and means for establishing the at least one bearer with the core network. The apparatus further includes means for receiving a packet from the core network over the at least one bearer and means for communicating the packet to a relay eNB for providing to the UE.

Still another aspect relates to a computer program product, which can have a computer-readable medium including code for causing at least one computer to obtain one or more parameters regarding at least one bearer to establish with a core network for communicating with a UE from a donor eNB as part of a handover procedure and code for causing the at least one computer to activate the at least one bearer with the core network. The computer-readable medium can also comprise code for causing the at least one computer to obtain a packet from the core network over the at least one bearer and code for causing the at least one computer to communicate the packet to a relay eNB for providing to the UE.

Moreover, an additional aspect relates to an apparatus a bearer information receiving component that obtains one or more parameters regarding at least one bearer to establish with a core network for communicating with a UE from a donor eNB as part of a handover procedure and a bearer establishment requesting component that activates the at least one bearer with the core network. The apparatus can further include a backhaul link component that receives a packet from the core network over the at least one bearer and a packet routing component that communicates the packet to a relay eNB for providing to the UE.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed and this description is intended to include all such aspects and their equivalents.

DETAILED DESCRIPTION

Figure 1:
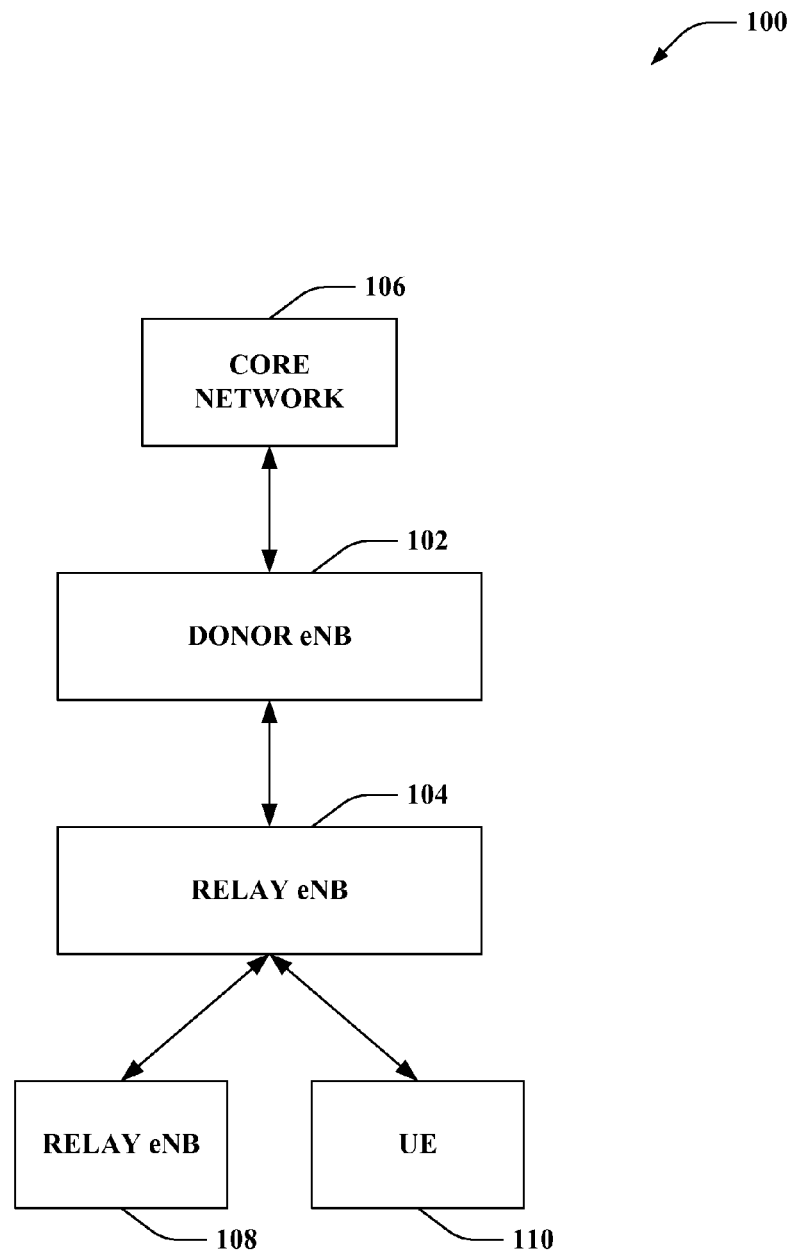
FIG. 1 is an illustration of an example wireless communications system that facilitates providing relays for wireless networks.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, various aspects are described herein in connection with a terminal, which can be a wired terminal or a wireless terminal A terminal can also be called a system, device, subscriber unit, subscriber station, mobile station, mobile, mobile device, remote station, remote terminal, access terminal, user terminal, terminal, communication device, user agent, user device, or user equipment (UE). A wireless terminal may be a cellular telephone, a satellite phone, a cordless telephone, a Session Initiation Protocol (SIP) phone, a wireless local loop (WLL) station, a personal digital assistant (PDA), a handheld device having wireless connection capability, a computing device, or other processing devices connected to a wireless modem. Moreover, various aspects are described herein in connection with a base station. A base station may be utilized for communicating with wireless terminal(s) and may also be referred to as an access point, a Node B, or some other terminology.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), cdma2000, etc. UTRA includes Wideband-CDMA (W-CDMA) and other variants of CDMA. Further, cdma2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on the downlink and SC-FDMA on the uplink. UTRA, E-UTRA, UMTS, LTE and GSM are described in documents from an organization named "3rd Generation Partnership Project" (3GPP). Additionally, cdma2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Referring to FIG. 1, a wireless communication system 100 is illustrated that facilitates providing relay functionality in wireless networks. System 100 includes a donor eNB 102 that provides one or more relay eNBs, such as relay eNB 104, with access to a core network 106. Similarly, relay eNB 104 can provide one or more disparate relay eNBs, such as relay eNB 108, or UEs, such as UE 110, with access to the core network 106 via donor eNB 102. Donor eNB 102, which can also be referred to as a cluster eNB, can communicate with the core network 106 over a wired or wireless backhaul link, which can be an LTE or other technology backhaul link. In one example, the core network 106 can be a 3GPP LTE or similar technology network.

Donor eNB 102 can additionally provide an access link for relay eNB 104, which can also be wired or wireless, LTE or other technologies, and the relay eNB 104 can communicate with the donor eNB 102 using a backhaul link over the access link of the donor eNB 102. Relay eNB 104 can similarly provide an access link for relay eNB 108 and/or UE 110, which can be a wired or wireless LTE or other technology link. In one example, donor eNB 102 can provide an LTE access link, to which relay eNB 104 can connect using an LTE backhaul, and relay eNB 104 can provide an LTE access link to relay eNB 108 and/or UE 110. Donor eNB 102 can connect to the core network 106 over a disparate backhaul link technology. Relay eNB 108 and/or UE 110 can connect to the relay eNB 104 using the LTE access link to receive access to core network 106, as described. A donor eNB and connected relay eNBs can be collectively referred to herein as a cluster.

According to an example, relay eNB 104 can connect to a donor eNB 102 at the link layer (e.g., media access control (MAC) layer) as would a UE in conventional LTE configurations. In this regard, donor eNB 102 can act as a conventional LTE eNB requiring no changes at the link layer or related interface (e.g., user-to-user (Uu), such as E-UTRA-Uu) to support the relay eNB 104. In addition, relay eNB 104 can appear to UE 110 as a conventional eNB at the link layer, such that no changes are required for UE 110 to connect to relay eNB 104 at the link layer, for example. In addition, relay eNB 104 can configure procedures for resource partitioning between access and backhaul link, interference management, idle mode cell selection for a cluster, and/or the like. It is to be appreciated that relay eNB 104 can connect to additional donor eNBs, in one example.

With respect to transport layer communications, transport protocols related to relay eNB 108 or UE 110 communications can terminate at the donor eNB 102, referred to as cell relay functionality, since the relay eNB 104 is like a cell of the donor eNB 102. For example, in a cell relay configuration, donor eNB 102 can receive communications for the relay eNB 104 from the core network 106, terminate the transport protocol, and forward the communications to the relay eNB 104 over a disparate transport layer keeping the application layer substantially intact. It is to be appreciated that the forwarding transport protocol type can be the same as the terminated transport protocol type, but is a different transport layer established with the relay eNB 104.

Relay eNB 104 can determine a relay eNB or UE (e.g., relay eNB 108 or UE 110) related to the communications, and provide the communications to the relay eNB or UE (e.g., based on an identifier thereof within the communications). Similarly, donor eNB 102 can terminate the transport layer protocol for communications received from relay eNB 104, translate the communications to a disparate transport protocol, and transmit the communications over the disparate transport protocol to the core network 106 with the application layer intact for relay eNB 104 as a cell relay. In these examples, where relay eNB 104 is communicating with another relay eNB, the relay eNB 104 can support application protocol routing to ensure communications reach the correct relay eNB.

In an example, a packet data convergence protocol (PDCP) layer for relay eNB 108 (or related devices communicating therewith) and/or UE 110 can also be terminated at the donor eNB 102. In this example, for packets or other data received from relay eNB 108, UE 110, or other relay eNBs or UEs communicating with relay eNB 104, relay eNB 104 can forward the packets or other data to donor eNB 102 (and vice versa) without determining the PDCP payload. In this regard, security and encryption considerations can be handled at the donor eNB 102 and a node from which the packet or other data originated, which can be relay eNB 108, UE 110, etc. Thus, relay eNB 104 and/or other intermediary relay eNBs need not decrypt and re-encrypt communications (or apply other security procedures) upon receiving and forwarding the packets or other data.

For example, upon receiving packets from a relay eNB 108 or UE 110, relay eNB 104 can forward the packets to donor eNB 102, without analyzing the PDCP layer payload, based at least in part on an identifier or address specified in a radio link control (RLC) or similar layer. Similarly, relay eNB 104 can forward packets from donor eNB 102 to relay eNB 108 or UE 110 without processing the PDCP layer. In an example, relay eNB 104 can analyze a PDCP header of the packets to discern one or more parameters for communicating to donor eNB 102. For instance, to assist in flow control, sequence number (SN) status transfer, etc., relay eNB 104 can acquire one or more parameters from a header of a PDCP layer of a packet from donor eNB 102 to relay UE 110 (e.g., such as an SN or similar parameters), and specify the one or more parameters to donor eNB 102. In addition, for example, relay eNB 104 can send PDCP layer feedback information to donor eNB 102 related to communicating packets from donor eNB 102 to relay eNB 108 or UE 110.

In addition, donor eNB 102 can store PDCP layer contexts for each UE (e.g., UE 110), relay eNB (e.g., relay eNB 104), or other device with which donor eNB 102 ultimately communicates (e.g., via intermediary relay eNBs). In this regard, donor eNB 102 can store and/or analyze the PDCP layer feedback according to a related context for relay eNB 108 or UE 110 for subsequent use in communicating with the relay eNB 108 or UE 110. Moreover, donor eNB 102, in an example, can multiplex PDCP layer communications over a single Un or other radio protocol interface with relay eNB 104 to provide PDCP contexts for communicating with the related devices. It is to be appreciated, however, that donor eNB 102 can maintain less than one context per PDCP layer communication, and in one example, can have one PDCP context to handle substantially all PDCP layer communications therewith.

Moreover, for example, relay eNB 104 can transmit the one or more parameters from the PDCP header of the packets to donor eNB 102 in a handover procedure. For example, where relay eNB 104 is handing over UE 110 communications to donor eNB 102 or a target relay eNB (not shown) served by donor eNB 102, relay eNB 104 can communicate the one or more parameters from the PDCP header, such as a SN of a last packet transmitted to UE 110, to the donor eNB 102. Donor eNB 102, for example, can utilize the SN to continue communications, or cause the target eNB to continue communications, with UE 110. In addition, where relay eNB 104 hands over UE 110 to a target relay eNB served by donor eNB 102, donor eNB 102 can request bearer establishment at the target relay eNB based on bearers established at relay eNB 104 for communicating with UE 110.

In an example, where relay eNB 104 hands over UE 110 to a target eNB served by a target donor eNB (not shown), or the target donor eNB itself, donor eNB 102 can forward the SN, bearer information for establishing bearers at the target relay eNB and in the core network related to the target donor eNB, and/or the like, to the target donor eNB as part of the handover. In addition, relay eNB 104 can provide contents of an uplink (UL) buffer to donor eNB 102, where the UL buffer contents correspond to communications from UE 110 intended for core network 106 or donor eNB 102. It is to be appreciated that a buffer can be utilized for temporarily storing communications from UE 110 intended for donor eNB 102 or a disparate upstream node (and/or vice versa) as the link between relay eNB 104 and donor eNB 102 (and relay eNB 104 and UE 110) can be a wireless link with varying quality of service (QoS). In this example, donor eNB 102 can provide the UL buffer contents to the target donor eNB for processing. Moreover, donor eNB 102 can handover additional contextual information regarding the UE, such as one or more PDCP parameters, a PDCP buffer related to communications to be transmitted to UE 110 (e.g., where the buffer is used to control flow of packets to UE 110), and/or the like.

In yet another example, relay eNB 104 can be handed over to the target donor eNB. In this regard, UEs and relay eNBs served by relay eNB 104 can be handed over to the target donor eNB as well. To promote seamless handover of the relay eNB 104, as to its downstream nodes, donor eNB 102 can transmit the SN information, bearer information, PDCP parameters, etc., as described, to the target donor eNB for all UEs or other downstream nodes connected to relay eNB 104. In this example, the target donor eNB can establish bearers with its core network for the UEs or other downstream nodes. In addition, the target donor eNB can continue communicating with the UEs and other downstream nodes according to the PDCP parameters and SN information, as described herein.

Figure 2:
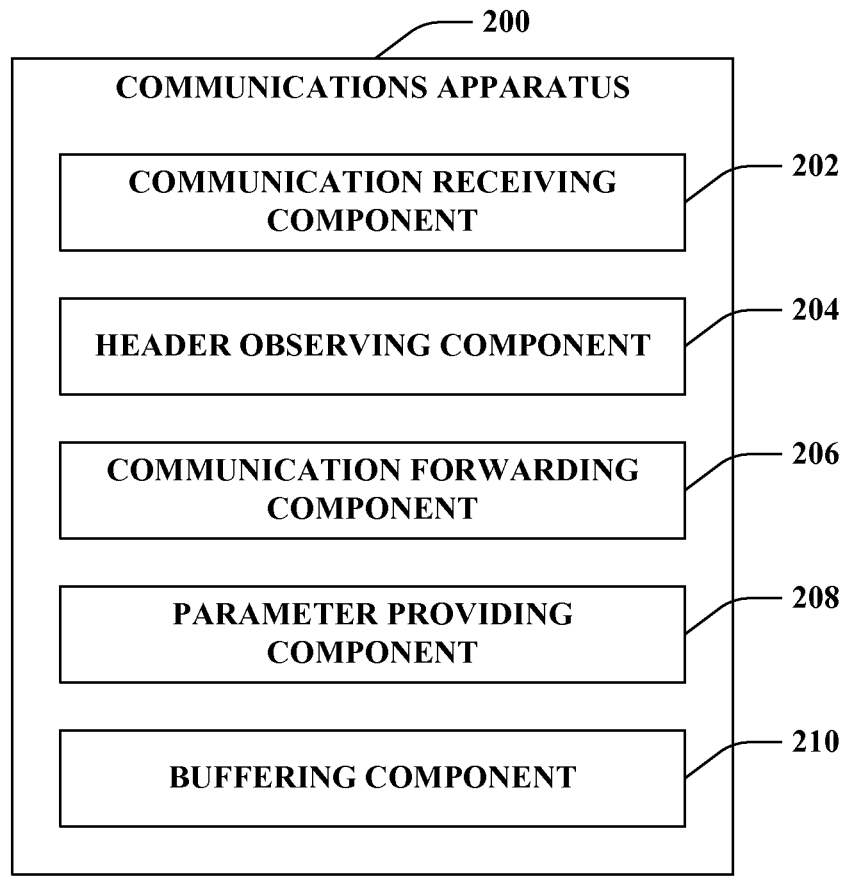
FIG. 2 is an illustration of an example communications apparatus for employment within a wireless communications environment.

Turning to FIG. 2, illustrated is a communications apparatus 200 for employment within a wireless communications environment. The communications apparatus 200 can be a base station or a portion thereof, a mobile device or a portion thereof, or substantially any communications apparatus that receives data transmitted in a wireless communications environment. The communications apparatus 200 can include a communication receiving component 202 that obtains one or more packets from a disparate apparatus (not shown), a header observing component 204 that retrieves one or more parameters of a header in the one or more packets to facilitate flow control of the one or more packets, a communication forwarding component 206 that transmits the one or more packets to a device, a parameter providing component 208 that provides the one or more parameters to the disparate apparatus to facilitate flow control of the one or more packets, handover, and/or the like, and a buffering component 210 that temporarily stores one or more packets received from a device until transmitted to the disparate apparatus and/or vice versa.

According to an example, communication receiving component 202 can obtain a packet from a disparate apparatus (e.g., a donor eNB), which can include multiple layers, such as a PDCP layer as described. For example, the packet can have layers that comprise the PDCP layer, such as a layer 1 (L1), MAC layer, RLC layer, etc., and/or layers within the PDCP layer, such as internet protocol (IP) layer, or substantially any application or higher layer that supports control or user plane message exchange between the communications apparatus 200 and a device (e.g., a UE). Header observing component 204 can obtain one or more parameters from a header of the packet, such as a PDCP header, for instituting flow control. For example, header observing component 204 can obtain a SN from the header of the packet, as described.

In addition, communication forwarding component 206 can transmit the packet to a device for which the packet is intended (which can be determined according to an identifier in the packet, for example). In an example, communication forwarding component 206 can communicate with a device using a wireless interface. Thus, packets can be received at communication receiving component 202 at a faster or slower pace than communication forwarding component 206 can effectively communicate them to the device. In this example, buffering component 210 can temporarily store one or more packets received by communication receiving component 202 until communication forwarding component 206 can transmit the packet, as described. In this regard, parameter providing component 208 can communicate the SN of a last packet transmitted by communication forwarding component 206 to the disparate apparatus to facilitate flow control at the disparate apparatus following a handover procedure.

In addition, for example, parameter providing component 208 can also transmit a maximum size of a buffer in buffering component 210 to facilitate determining buffer capacity (e.g., based at least in part on the SN of the last packet transmitted by communication forwarding component 206 and an SN of the last packet transmitted by the disparate apparatus). In any case, parameter providing component 208 can transmit such parameters to the disparate apparatus, which can utilize the parameters to control flow of packets to communications apparatus 200. For example, where a buffer in buffering component 210 has low capacity (e.g., below a threshold capacity), the disparate apparatus can slow the flow of packets to communications apparatus 200. Parameter providing component 208 can transmit the parameters to the disparate apparatus according to a timer, according to one or more events (e.g., a buffer capacity moving below a threshold capacity), and/or the like.

In addition, parameter providing component 208 can transmit such parameters during a handover procedure. In this example, parameter providing component 208 can provide an SN of the last packet transmitted to a device related to the handover. The SN can be utilized to continue communications to the device at the target eNB (e.g., continuing with the packet after that indicated by the SN). Moreover, for example, communication receiving component 202 can obtain a packet from the device for providing to the disparate apparatus. As described, buffering can be utilized in this example as well to control flow of UL packets. In this example, where an inter-cell handover is initiated by communications apparatus 200 for the device, buffering component 210 can transmit contents of one or more device-related UL buffers to the disparate apparatus, as described. An inter-cell handover can refer to handing over a UE to a relay eNB (or donor eNB) in a disparate cluster, and intra-cell handover can refer to handing over a UE within a cluster. Thus, the buffer contents can additionally be used in an inter-cell handover to ensure packets from the device are provided the core network by the disparate apparatus.

Figure 3:
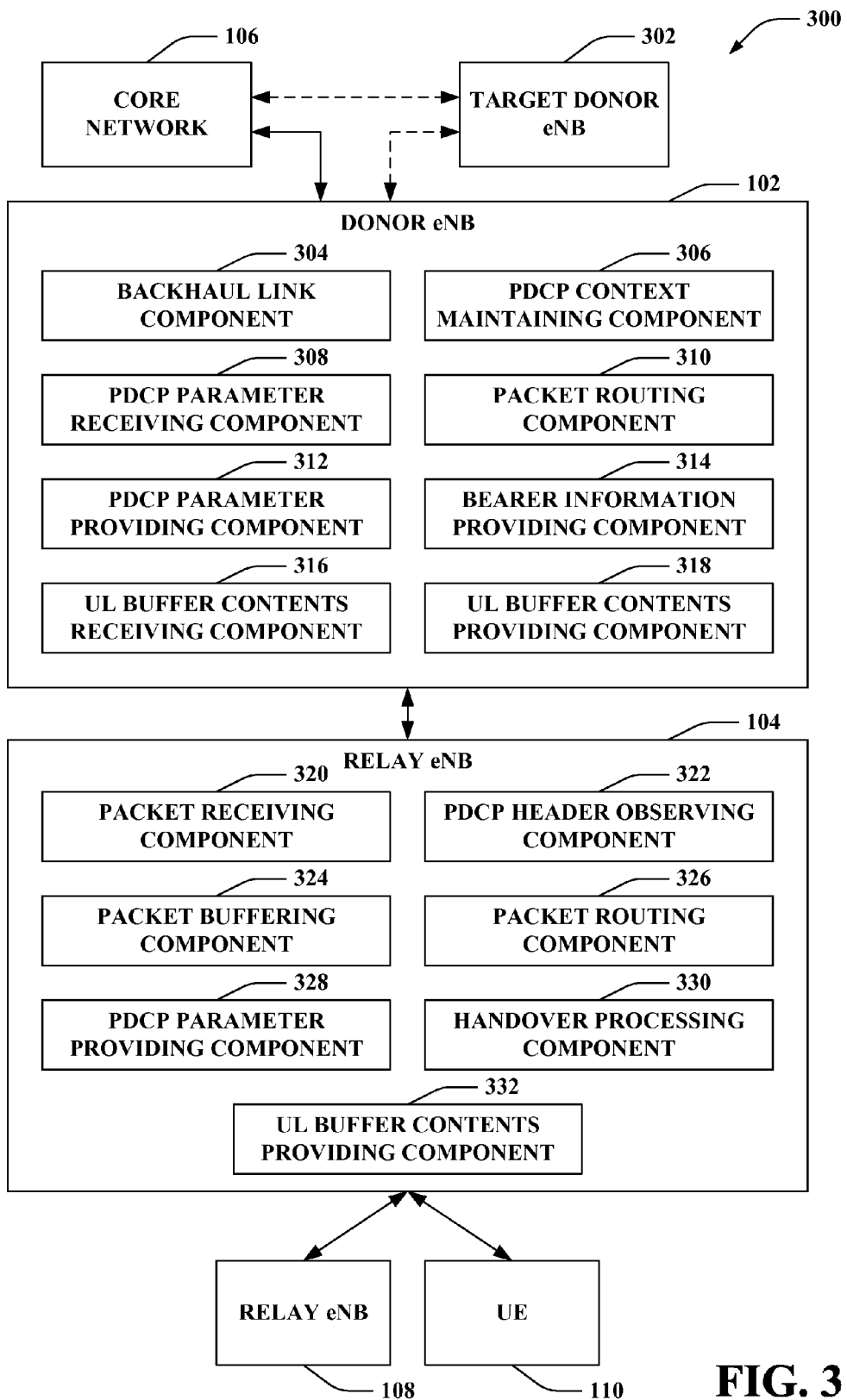
FIG. 3 is an illustration of an example wireless communications system for transmitting parameters to facilitate handing over communications among one or more evolved Node Bs (eNB).

Turning now to FIG. 3, an example wireless communication system 300 that facilitates routing packets in a wireless network and supporting handover of one or more devices to which packets are routed is illustrated. System 300 includes a donor eNB 102 that provides relay eNB 104 (and/or other relay eNBs or one or more devices) with access to core network 106. Additionally, as described, relay eNB 104 can provide relay eNB 108 and UE 110 with access to the core network 106 through the donor eNB 102. System 300 also includes a target donor eNB 302 that supports inter-cluster handover, in one example, and similar provides devices and/or relay eNBs with access to core network 106. Moreover, for example, there can be multiple relay eNBs 104 between the donor eNB 102 and relay eNB 108 or UE 110. In addition, it is to be appreciated that relay eNB 108 can comprise the components of relay eNB 104 and provide similar functionality, in one example. Moreover, donor eNB 102 and/or target donor eNB 302 can be a macrocell access point, femtocell access point, picocell access point, mobile base station, and/or the like. Relay eNB 104 (and relay eNB 108) can similarly be mobile or stationary relay nodes that communicate with donor eNB 102 (and relay eNB 104) over a wireless or wired backhaul, as described.

Donor eNB 102 comprises a backhaul link component 304 that communicates with a core network and/or a target donor eNB (e.g., directly or via the core network) to provide wireless network access to one or more relay eNBs and/or UEs, a PDCP context maintaining component 306 that stores one or more parameters related to a PDCP context of one or more UEs communicating with donor eNB 102 (e.g., via one or more relay eNBs or otherwise), which can include one or more buffers for controlling flow of communications to a relay eNB, and a PDCP parameter receiving component 308 that can obtain one or more parameters regarding PDCP layer communications with the one or more UEs. Donor eNB 102 can also include a packet routing component 310 that can transmit packets received from a core network to an intended UE or relay eNB (e.g., via one or more intermediary relay eNBs).

In addition, donor eNB 102 comprises a PDCP parameter providing component 312 that can transmit one or more received PDCP parameters regarding PDCP layer communications with the one or more UEs to a disparate eNB (e.g., a served relay eNB, a target donor eNB, etc.), a bearer information providing component 314 that transmits one or more parameters related to radio bearers established at the relay eNB to the target donor eNB (e.g., for establishing at a target relay eNB), a UL buffer contents receiving component 316 that obtains UL buffer contents from a relay eNB of packets obtained from a UE but not yet transmitted to the donor eNB, and a UL buffer contents providing component 318 that transmits the UL buffer contents to a served relay eNB, target donor eNB, and/or the like.

Relay eNB 104 can comprise a packet receiving component 320 that obtains one or more packets from a donor eNB for providing to a UE (e.g., via one or more additional relay eNBs or otherwise), a PDCP header observing component 322 that retrieves one or more parameters from a PDCP header of the one or more packets to facilitate flow control at the donor eNB, and a packet buffering component 324 that temporarily stores one or more packets received from the donor eNB for transmitting to the UE and/or vice versa. Relay eNB 104 additionally includes a packet routing component 326 that transmits one or more packets received from a donor eNB (e.g., one or more packets in packet buffering component 324) to a UE and a PDCP parameter providing component 328 that transmits the one or more parameters from the PDCP header of the one or more packets to the donor eNB to facilitate flow control, handover, etc. In addition, relay eNB 104 can comprise a handover processing component 330 that initiates a handover procedure for a UE and a UL buffer contents providing component 332 that transmits contents of a UL buffer related to communications from the UE to a donor eNB during inter-cell handover.

According to an example, as described, donor eNB 102 can communicate packets from core network 106 to relay eNB 104 for providing to UE 110. Backhaul link component 304 can receive packets from core network 106 intended for UE 110. PDCP context maintaining component 306 can obtain a PDCP context related to UE 110 from a plurality of stored PDCP contexts. For example, PDCP context maintaining component 306 can locate the PDCP context based at least in part on an identifier in the packets. In addition, as described, PDCP context maintaining component 306 can manage a buffer related to the PDCP context for temporarily storing packets for UE 110 to facilitate flow control of packets to one or more relay eNBs. In one example, upon obtaining the PDCP context, PDCP context maintaining component 306 can store the packets received from core network 106 in the related buffer. In addition, packet routing component 310 can transmit one or more of the packets from the buffer to relay eNB 104 (e.g., based on one or more flow control parameters related to the PDCP context).

Packet receiving component 320 can obtain the one or more packets, and PDCP header observing component 322 can retrieve one or more parameters from a PDCP layer header of the one or more packets. As described, the one or more parameters can include an SN of the one or more packets. Packet buffering component 324, in an example, can store the one or more packets for transmitting to UE 110. It is to be appreciated that relay eNB 104 can associate the one or more packets with UE 110 according to an identifier in the one or more packets and/or the like. Packet routing component 326 can transmit one or more packets from the packet buffering component 324 to UE 110. In addition, for example, PDCP parameter providing component 328 can transmit the one or more parameters from the PDCP layer header to donor eNB 102.

As described, for example, PDCP parameter providing component 328 can communicate an SN of a last packet transmitted to UE 110 by packet routing component 326 (and/or a buffer size, capacity, etc.) to facilitate flow control, as part of a handover procedure, and/or the like. In another example, PDCP parameter providing component 328 can communicate an SN of a last packet received by UE 110 (e.g., according to feedback transmitted by UE 110 to relay eNB 104). In addition, PDCP parameter providing component 328 can transmit the SN or other PDCP parameters according to a timer, upon request, upon occurrence of an event, during a handover procedure, and/or the like. PDCP parameter receiving component 308 can obtain the SN, and PDCP context maintaining component 306 can apply the SN to the PDCP context of UE 110, as described herein.

In an example, handover processing component 330 can determine to initiate a handover procedure for UE 110. This can include receiving measurement reports from UE 110 related to one or more neighboring eNBs, determining to handover to a neighboring eNB based on parameters in the measurement reports (such as signal-to-noise ratio (SNR)), etc. During the handover procedure for UE 110, PDCP parameter providing component 328 can transmit the SN of the last packet communicated to UE 110 by packet routing component 326, as described, to donor eNB 102. PDCP parameter receiving component 308 can obtain the SN of the last packet communicated to UE 110 and can utilize the SN to continue communications with UE 110, or cause a target eNB to continue communications with UE 110.

For example, where handover processing component 330 initiates the handover procedure to handover UE 110 to a target relay eNB served by donor eNB 102 (or to the donor eNB 102), PDCP context maintaining component 306 can store the SN as the SN of the last packet communicated to UE 110. Following handover, thus, PDCP context maintaining component 306 can determine a packet in a buffer corresponding to a next SN following the SN of the last packet communicated to UE 110 where the buffer relates to a PDCP context of UE 110. Packet routing component 310 can then begin transmitting packets from the buffer of the PDCP context to the target relay eNB or UE starting at the next SN. Moreover, as described further herein, donor eNB 102 can request radio bearer establishment from the target eNB for communicating with UE 110.

In another example, handover processing component 330 can initiate an inter-cell handover procedure with donor eNB 102 to handover UE 110 to a target eNB served by target donor eNB 302 (or to target donor eNB 302). In this example, PDCP parameter receiving component 308 can receive the SN of the last packet transmitted to UE 110 by packet routing component 326, and PDCP context maintaining component 306 can store the SN, as described above. To facilitate handover to the target relay eNB under target donor eNB 302 (or to target donor eNB 302), PDCP parameter providing component 312 can communicate at least a portion of the PDCP context related to UE 110 to the target donor eNB 302. For example, PDCP parameter providing component 312 can transmit contents of the buffer related to the PDCP context starting at the SN following the received SN. Thus, target donor eNB 302 can transmit the contents of the buffer to the target relay eNB beginning with a packet after the last packet transmitted to the UE 110 (e.g., and according to established flow control at target donor eNB 302), in one example.

Furthermore, in this example, bearer information providing component 314 can transmit one or more parameters regarding bearers established in core network 106 and radio bearers established by relay eNB 104 for communicating with UE 110 to target donor eNB 302. For instance, target donor eNB 302 can utilize the parameters to establish similar bearers with core network 106 (or one or more components thereof related to target donor eNB 302) and to establish or request establishment of similar radio bearers by the target relay eNB, as described further herein. In addition, for example, when handover processing component 330 initiates an inter-cell handover, UL buffer contents providing component 332 can communicate packets in a UL buffer, received from UE 110 for providing to donor eNB 102, to donor eNB 102. UL buffer contents receiving component 316 can obtain the contents from relay eNB 104, and UL buffer contents providing component 318 can transmit the buffer contents to target donor eNB 302. In this regard, as described further below, target donor eNB 302 can transmit packets to core network 106 based on the buffer contents to process the packets from UE 110. Thus, responding packets generated by core network 106 based on the packets in the buffer contents can be provided to target donor eNB 302 (e.g., for providing to a target relay eNB or otherwise transmitting to UE 110).

Figure 4:
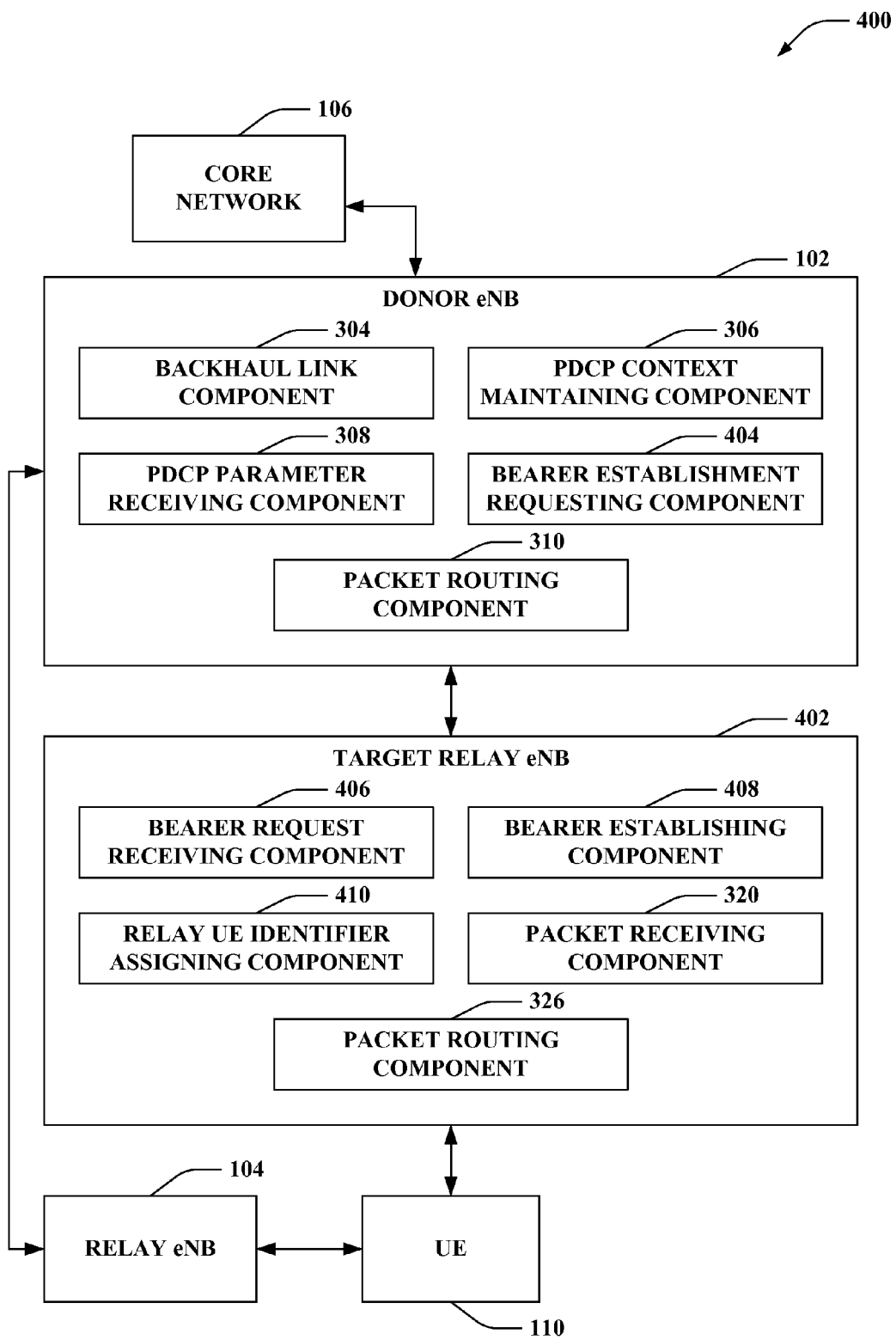
FIG. 4 is an illustration of an example wireless communications system that facilitates performing an intra-cluster handover of a user equipment (UE) to a target relay eNB.

Referring to FIG. 4, illustrated is an example wireless communication system 400 that facilitates performing an intra-cluster handover of a device to a target relay eNB. System 400 includes a donor eNB 102 that provides relay eNB 104, target relay eNB 402 (and/or other relay eNBs or one or more devices) with access to core network 106. Additionally, as described, relay eNB 104 can provide UE 110 with access to the core network 106 through the donor eNB 102, as can target relay eNB 402 following a handover procedure, as described. Moreover, for example, there can be multiple relay eNBs 104 between the donor eNB 102 and UE 110. In addition, it is to be appreciated that relay eNB 104 can comprise the components of target relay eNB 402 and provide similar functionality, in one example. Further, donor eNB 102 can be a macrocell access point, femtocell access point, picocell access point, mobile base station, and/or the like, as described. Relay eNB 104 and target relay eNB 402 can similarly be mobile or stationary relay nodes that communicate with donor eNB 102 over a wireless or wired backhaul, as described.

Donor eNB 102 comprises a backhaul link component 304 that communicates with a core network and/or a target donor eNB (e.g., directly or via the core network) to provide wireless network access to one or more relay eNBs and/or UEs, a PDCP context maintaining component 306 that stores one or more parameters related to a PDCP context of one or more UEs communicating with donor eNB 102 (e.g., via one or more relay eNBs or otherwise), which can include one or more buffers for controlling flow of communications to a relay eNB, and a PDCP parameter receiving component 308 that can obtain one or more parameters regarding PDCP layer communications with the one or more UEs. Donor eNB 102 can also include a bearer establishment requesting component 404 that generates and transmits a request to establish one or more radio bearers for communicating with an eNB and a packet routing component 310 that can transmit packets received from a core network to an intended UE or relay eNB (e.g., via one or more intermediary relay eNBs).

Target relay eNB 402 can comprise a bearer request receiving component 406 that obtains a request to establish one or more radio bearers for communicating with a UE, a bearer establishing component 408 that initializes and activates the one or more radio bearers for communicating with the UE, and a relay UE identifier assigning component 410 that generates a relay UE identifier for the UE. Target relay eNB 402 additionally includes a packet receiving component 320 that obtains one or more packets from a donor eNB for providing to a UE (e.g., via one or more relay eNBs or otherwise) and a packet routing component 326 that transmits one or more packets received from a donor eNB to a UE.

According to an example, as described, donor eNB 102 can communicate packets from core network 106 to relay eNB 104 for providing to UE 110, as described. Backhaul link component 304 can receive packets from core network 106 intended for UE 110. PDCP context maintaining component 306 can obtain a PDCP context related to UE 110 from a plurality of stored PDCP contexts. For example, PDCP context maintaining component 306 can locate the PDCP context based at least in part on an identifier in the packets. In addition, as described, PDCP context maintaining component 306 can maintain a buffer related to the PDCP context for temporarily storing packets for UE 110 to facilitate flow control of packets to one or more relay eNBs. In one example, upon obtaining the PDCP content, PDCP context maintaining component 306 can store the packets received from core network 106 in the related buffer. In addition, packet routing component 310 can transmit one or more of the packets to relay eNB 104 (e.g., based on one or more flow control parameters related to the PDCP context) for providing to UE 110, as described.

Moreover, for example, relay eNB 104 can initiate a handover procedure to handover UE 110 to target relay eNB 402. As described, relay eNB 104 can communicate one or more parameters to donor eNB 102 as part of the handover procedure. PDCP parameter receiving component 308 can obtain the one or more parameters, and PDCP context maintaining component 306 can apply the one or more parameters to a PDCP context related to UE 110, as described. The one or more parameters can include an SN of a last packet transmitted to UE 110 by relay eNB 104 (or received by UE 110, as described). Thus, for instance, packet routing component 310 can continue transmitting packets in a buffer related to the PDCP context to target relay eNB 402 beginning with a packet having an SN following the SN received by PDCP parameter receiving component 308.

In addition, bearer establishment requesting component 404 can transmit a request to establish one or more radio bearers to target relay eNB 402 for communicating with UE 110. For example, the request can relate to one or more radio bearers established by relay eNB 104 to communicate with UE 110. Bearer request receiving component 406 can obtain the request to establish the one or more radio bearers, and bearer establishing component 408 can activate the one or more radio bearers with UE 110 (e.g., by transmitting an radio resource control (RRC) connection reconfiguration or similar message). Bearer establishing component 408 can communicate one or more parameters regarding the established radio bearer(s) to donor eNB 102, such as a relay radio bearer identifier or similar parameter, and donor eNB 102 can associate the established radio bearer with a bearer in core network 106 for routing communications from core network 106 to UE 110 through the target relay eNB 402.

Moreover, for example, relay UE identifier assigning component 410 can generate and assign a UE portion of a relay UE identifier to UE 110 (e.g., upon bearer request receiving component 406 obtaining the request to establish radio bearers or otherwise during the handover procedure). Furthermore, relay UE identifier assigning component 410 can indicate the relay UE identifier related to UE 110 to donor eNB 102. The relay UE identifier can be utilized, in one example, for associating communications with UE 110. Thus, following handover, for example, target relay eNB 402 can receive one or more packets from UE 110, associate the relay UE identifier to the one or more packets, and transmit the one or more packets to donor eNB 102. Donor eNB 102 can associate the relay UE identifier to communications sent to core network 106 related to the one or more packets. Upon receiving responding packets or other packets related to UE 110 from core network 106 over backhaul link component 304, donor eNB 102 can associate the relay UE identifier with the one or more packets, and packet routing component 310 can transmit the one or more packets to target relay eNB 402 and/or one or more intermediary relay eNBs (not shown) for providing to UE 110.

For example, PDCP parameter receiving component 308, or a similar receiving component, can obtain the relay UE identifier for associating with the PDCP context related to UE 110. As described in one example, following handover, packet routing component 310 can transmit packets from a buffer related to UE 110 in PDCP context maintaining component 306 to target relay eNB 402. For example, the relay UE identifier can be included in the packets, as described, to facilitate identifying target relay eNB 402 and/or UE 110. Packet receiving component 320 can obtain the packets, and packet routing component 326 can transmit the packets to UE 110 (e.g., based on a UE portion of the relay UE identifier).

Figure 5:
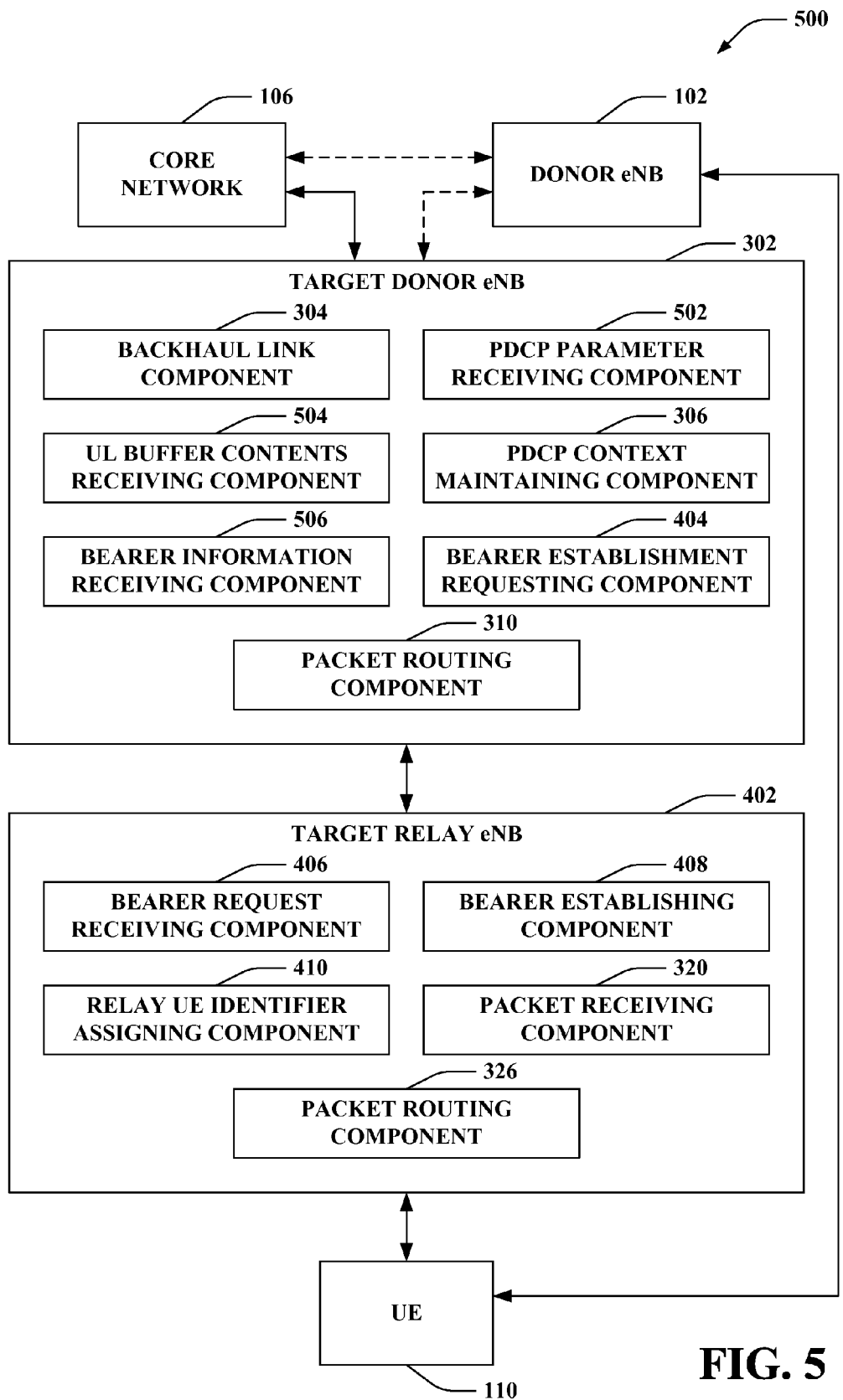
FIG. 5 is an illustration of an example wireless communications system that facilitates performing an inter-cluster handover of a UE to a target relay eNB.

Turning now to FIG. 5, an example wireless communication system 500 that facilitates routing packets in a wireless network and supporting inter-cell handover of one or more devices to which packets are routed is illustrated. System 500 includes a donor eNB 102 and a target donor eNB 302 that provide relay eNBs (such as target relay eNB 402) and/or one or more devices with access to core network 106. Additionally, target relay eNB 402 can provide UE 110 with access to the core network 106 through target donor eNB 302 following handover of UE 110 to target relay eNB 402. Moreover, for example, there can be multiple relay eNBs between the donor eNB 102 and target relay eNB 402 or UE 110. Moreover, donor eNB 102 and/or target donor eNB 302 can be a macrocell access point, femtocell access point, picocell access point, mobile base station, and/or the like. Target relay eNB 402 can similarly be a mobile or stationary relay node that communicates with target donor eNB 302 over a wireless or wired backhaul, as described.

Target donor eNB 302 comprises a backhaul link component 304 that communicates with a core network and/or a donor eNB (e.g., directly or via the core network) to provide wireless network access to one or more relay eNBs and/or UEs, a PDCP parameter receiving component 502 that obtains one or more PDCP parameters related to a UE from a source donor eNB during handover, and a UL buffer contents receiving component 504 that obtains one or more packets from a UL buffer related to a relay eNB serving the UE from the source donor eNB. Target donor eNB 302 additionally includes a PDCP context maintaining component 306 that stores one or more parameters related to a PDCP context of one or more UEs communicating with donor eNB 102 (e.g., via one or more relay eNBs or otherwise), which can include one or more buffers for controlling flow of communications to a relay eNB.

In addition, target donor eNB 302 comprises a bearer information receiving component 506 that obtains one or more parameters regarding one or more radio bearers established by a relay eNB serving the UE for communicating therewith as well as bearers for communicating to UE from one or more core network components. Target donor eNB 302 also comprises a bearer establishment requesting component 404 that generates and transmits a request to establish one or more radio bearers to a target relay eNB and/or one or more components of a core network, and a packet routing component 310 that can transmit packets received from a core network to an intended UE or relay eNB (e.g., via one or more intermediary relay eNBs).

Target relay eNB 402 can comprise a bearer request receiving component 406 that obtains a request to establish one or more radio bearers for communicating with a UE, a bearer establishing component 408 that communicates with the UE to establish the one or more radio bearers, and a relay UE identifier assigning component 410 that generates a UE portion of a relay UE identifier for a UE. Target relay eNB 402 additionally comprises a packet receiving component 320 that obtains one or more packets from a donor eNB for providing to a UE (e.g., via one or more relay eNBs or otherwise) and a packet routing component 326 that transmits one or more packets received from a donor eNB (e.g., one or more packets in packet buffering component 324) to a UE.

According to an example, backhaul link component 304 can receive packets from core network 106 intended for UE 110 following handover of UE 110 to target relay eNB 402. According to an example, as described, donor eNB 102 can communicate packets from core network 106 to UE 110 through one or more relay eNBs (not shown) or otherwise. A handover procedure, as described above, can be initiated by one or more relay eNBs serving UE 110 to handover UE 110 to target relay eNB 402. As part of the handover procedure, as described previously, donor eNB 102 can transmit one or more parameters to target donor eNB 302 (e.g., directly or via core network 106). For example, PDCP parameter receiving component 502 can obtain one or more PDCP parameters related to a context for UE 110 stored in donor eNB 102, as described. The one or more PDCP parameters can include a buffer of packets that have not been transmitted by donor eNB 102 to the relay eNB serving UE 110 before the handover procedure. PDCP content maintaining component 306 can store the one or more parameters for communicating with the UE 110 following the handover procedure.

In addition, UL buffer contents receiving component 504 can obtain one or more packets from a UL buffer of a relay eNB serving UE 110 before the handover procedure, as described. PDCP context maintaining component 306 can store the one or more packets and transmit the one or more packets to the core network 106 following the handover procedure so responding packets can be associated to target donor eNB 302, as described. Moreover, for example, bearer information receiving component 506 can obtain one or more parameters regarding radio bearers and/or core network bearers (e.g., system architecture evolution (SAE) bearers) to establish for UE 110, as described. Bearer establishment requesting component 404 can generate and transmit a request to establish one or more core network bearers to core network 106, and core network 106 can establish the bearers. For example, the bearers can be established by an MME, SGW, PGW, etc. of core network 106 that facilitate communication target donor eNB 302. It is to be appreciated that the parameters described above can be received by backhaul link component 304 from core network 106 or donor eNB 102 directly, and backhaul link component 304 can provide the parameters to the foregoing components, in one example.

Furthermore, bearer establishment requesting component 404 can create and transmit a request to establish one or more radio bearers for communicating with UE 110 to target relay eNB 402. In one example, the one or more radio bearers can relate to bearers previously established in core network 106, described above. Bearer request receiving component 406 can obtain the request to establish the one or more radio bearers, and bearer establishing component 408 can activate the bearer with UE 110 (e.g., by communicating an RRC connection reconfiguration or similar message to UE 110). In addition, relay UE identifier assigning component 410 can establish at least a UE portion of a relay UE identifier for UE 110. As described, the relay UE identifier can be subsequently utilized to associate upstream and downstream packets to UE 110.

Thus, in an example, the one or more parameters received by bearer information receiving component 506 can relate to establishing a bearer for voice communications of UE 110 previously established by component(s) of core network 106. The component(s) can have established the bearer for communicating packets to donor eNB 102 for providing to UE 110 (e.g., through a relay eNB serving UE 110 where not served by donor eNB 102). Bearer establishment requesting component 404 can request establishment of a bearer for voice communications related to UE 110 in core network 106. Bearer establishment requesting component 404 can further transmit a request to establish a related radio bearer to target relay eNB 402 for voice communications. Bearer request receiving component 406 can obtain the request, and bearer establishing component 408 can initialize and activate a radio bearer for voice communications related to UE 110.

Following establishment of the bearers, for example, PDCP context maintaining component 306 can forward UL buffer contents received from donor eNB 102 that correspond to the bearer for voice communications to the core network over the established core network bearer. Packets related to voice communications of the UE 110 can then be received from core network 106 over the associated core network bearer by backhaul link component 304. PDCP context maintaining component 306 can associate the received packets to a PDCP context related to UE 110 and can store the packets in a buffer for communicating, as described previously. Packet routing component 310 can transmit the packets to target relay eNB 402; in addition, for example, PDCP context maintaining component 306 can indicate an identifier of a radio bearer established by target relay eNB 402 for communicating with UE 110 over which to transmit the packets. Packet receiving component 320 can obtain the packets, and packet routing component 326 can forward packet to UE 110 (e.g., based on a relay UE identifier in the packets, as described) over the corresponding radio bearer established with UE 110 (e.g., as indicated in the packet received from target donor eNB 302 or otherwise). It is to be appreciated that target relay eNB 402 can subsequently receive packets from UE 110 and forward the packets to donor eNB 102, which can provide the packets to core network 106, as described. Furthermore, as described, core network 106 can transmit packets to target donor eNB 302 for providing to UE 110 via target relay eNB 402.

Figure 6:
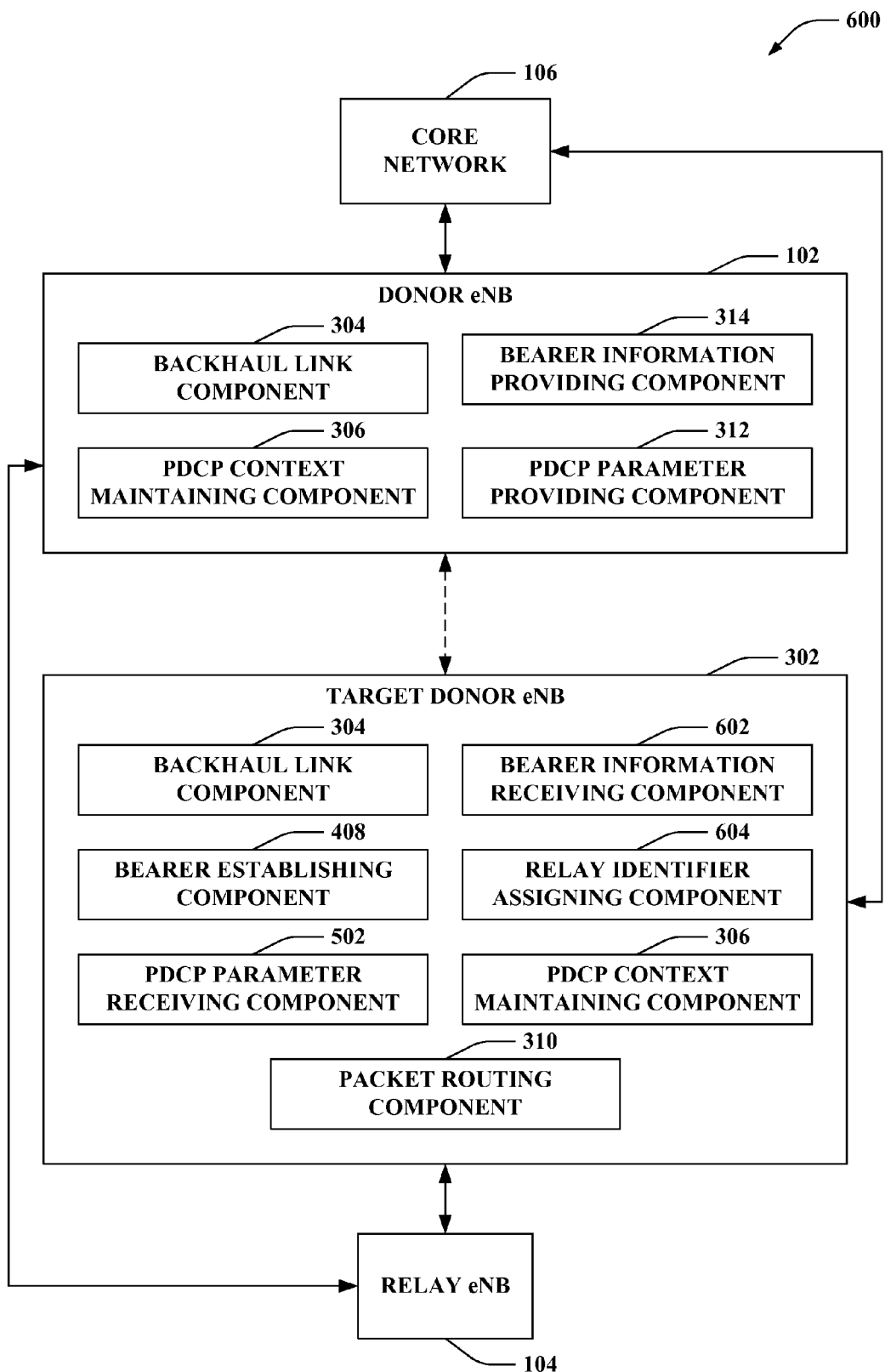
FIG. 6 is an illustration of an example wireless communications system that facilitates performing a handover of a relay eNB.

Referring to FIG. 6, illustrated is an example wireless communication system 600 that facilitates handing over relay eNB communications among donor eNBs. System 600 includes a donor eNB 102 that provides relay eNB 104 (and/or other relay eNBs or devices) with access to core network 106. Moreover, a target donor eNB 302 is illustrated that similarly provides core network access. Additionally, as described, relay eNB 104 can provide devices and/or other relay eNBs with access to the core network 106 through the donor eNB 102, as can target donor eNB 302 following a handover procedure, as described. Moreover, for example, there can be multiple relay eNBs 104 between the donor eNB 102 and UE 110. Further, donor eNB 102 and target donor eNB 302 can be macrocell access points, femtocell access points, picocell access points, mobile base stations, and/or the like, as described. Relay eNB 104 can similarly be a mobile or stationary relay node that communicates with donor eNB 102 and/or target donor eNB 302 (following handover) over a wireless or wired backhaul, as described.

Donor eNB 102 comprises a backhaul link component 304 that communicates with a core network and/or a target donor eNB (e.g., directly or via the core network) to provide wireless network access to one or more relay eNBs and/or UEs and a bearer information providing component 314 that transmits parameters regarding one or more radio bearers for communicating with a UE. Donor eNB 102 can also include a PDCP context maintaining component 306 that stores one or more parameters related to a PDCP context of one or more UEs communicating with donor eNB 102 (e.g., via one or more relay eNBs or otherwise), which can include one or more buffers for controlling flow of communications to a relay eNB, and a PDCP parameter providing component 312 that can transmit one or more parameters of a PDCP context related to one or more UEs served by a relay eNB to a target donor eNB to facilitate handing over the relay eNB thereto.

Target donor eNB 302 can include a backhaul link component 304 that communicates with a core network and/or a target donor eNB (e.g., directly or via the core network) to provide wireless network access to one or more relay eNBs and/or UEs, a bearer information receiving component 602 that obtains one or more parameters regarding one or more core network bearers to establish for communicating with one or more UEs served by a relay eNB during a handover procedure for the relay eNB, and a bearer establishing component 408 that requests bearer establishment with a core network. Target donor eNB 302 can also comprise a relay identifier assigning component 604 that generates at least a relay portion of a relay UE identifier for a relay eNB 104 as part of the handover procedure and a PDCP parameter receiving component 502 that obtains one or more parameters from a PDCP context for communicating with one or more UEs served by the relay eNB. Target donor eNB 302 additionally includes a PDCP context maintaining component 306 that stores one or more parameters related to a PDCP context of one or more UEs served by the relay eNB and a packet routing component 310 that transmits packets from core network 106 to one or more relay eNBs (for providing to a UE), as described.

According to an example, relay eNB 104 can communicate with donor eNB 102 to receive access to core network 106, as described. Relay eNB 104 can initiate a handover procedure to target donor eNB 302. For example, relay eNB 104 can determine to initiate the handover procedure based at least in part on comparing one or more parameters of donor eNB 102 to a similar parameter of target donor eNB 302 (e.g., SNR). In another example, donor eNB 102 can obtain such parameters from relay eNB 104 (e.g., in a measurement report) and can determine to initiate the handover procedure for relay eNB 104. In either case, as part of the handover procedure, bearer information providing component 314 can generate and transmit one or more parameters regarding bearers to establish in a core network. The one or more parameters can relate to, for example, bearers in the core network 106 that correspond to radio bearers established by relay eNB 104 for communicating with one or more UEs.

Bearer information receiving component 602 can obtain the one or more parameters, and bearer establishing component 408 can request bearer setup in core network 106 for the one or more bearers in the request. In addition, bearer establishing component 408 can map identifiers of the corresponding radio bearers established by relay eNB 104 to the bearers established in core network 106 to facilitate routing communications from the established bearers to the radio bearers of relay eNB 104 (e.g., for providing to the one or more UEs). In addition, relay identifier assigning component 604 can generate and provide a relay portion of a relay UE identifier to relay eNB 104. Relay eNB 104, for example, can utilize the relay portion to generate relay UE identifiers for the one or more UEs it serves to facilitate associating communications therewith, as described above.

Moreover, PDCP parameter providing component 312 can transmit one or more parameters of PDCP contexts related to the one or more UEs served by relay eNB 104 to target donor eNB 302, such as buffer contents related to the PDCP contexts. PDCP parameter receiving component 502 can obtain the one or more parameters of the PDCP contexts and can provide the one or more parameters to PDCP context maintaining component 306. Packet routing component 310 can utilize the one or more parameters for communicating with relay eNB 104. For example, packet routing component 310 can transmit one or more packets of buffers related to the one or more UEs to relay eNB 104. Moreover, for example, the parameters of the PDCP context can include flow control parameters established for relay eNB 104 by donor eNB 102. In this example, packet routing component 310 can transmit the packets to relay eNB 104 further based at least in part on flow control parameters for a given PDCP context. Thus, in one example, PDCP parameter providing component 312 can transmit PDCP contexts for substantially all UEs communicating with relay eNB 104 to target donor eNB 302 to facilitate handing over relay eNB 104 and continuing communications with UEs served by relay eNB 104.

Figure 7:
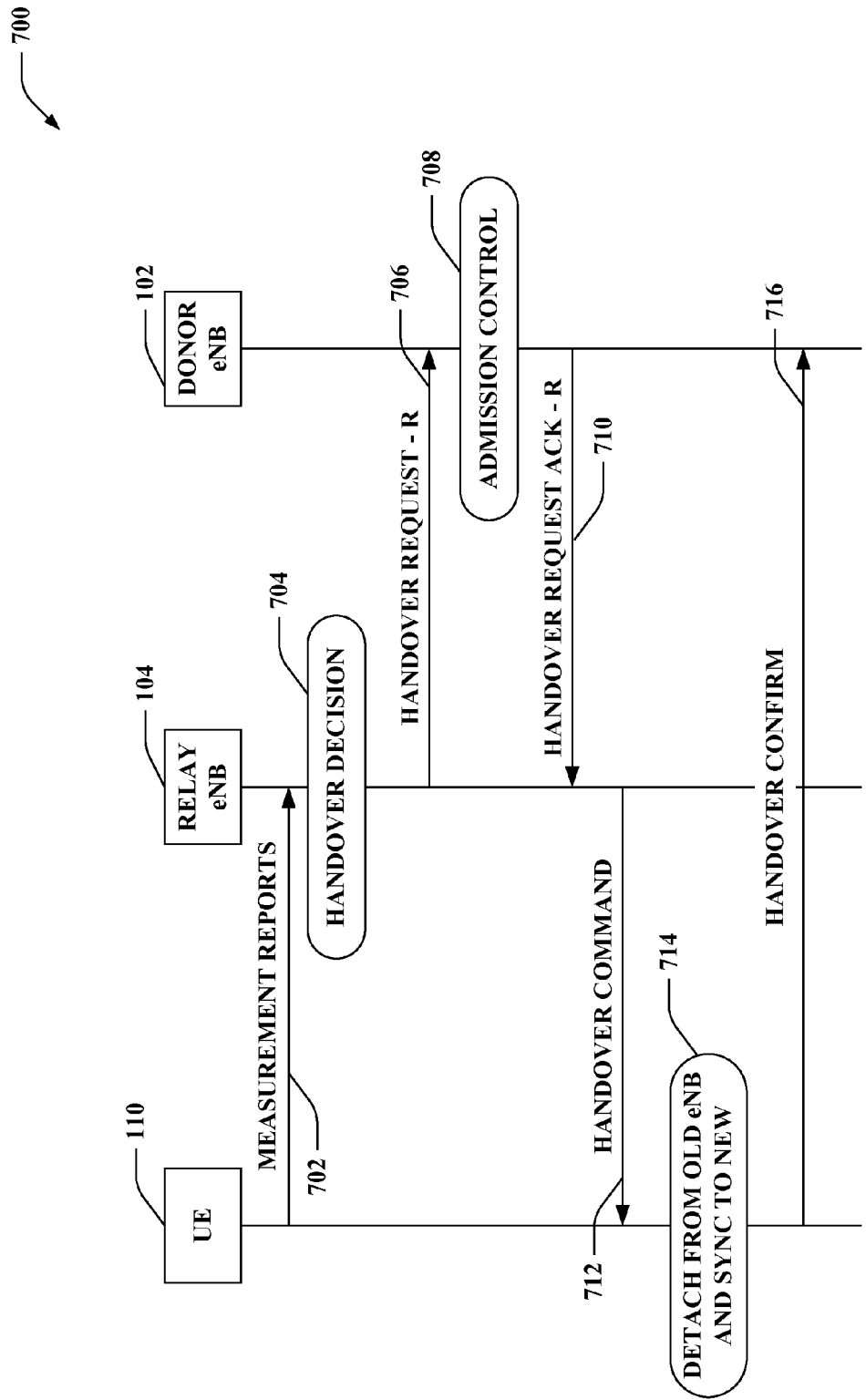
FIG. 7 is an illustration of an example wireless communications system that facilitates intra-cluster handover of a UE to a donor eNB.

Turning to FIG. 7, an example wireless communication system 700 is illustrated that facilitates intra-cluster handover for a UE from a relay eNB to its donor eNB. System 700 includes a donor eNB 102 that provides relay eNB 104 (and/or other relay eNBs) with access to a core network (not shown). Additionally, as described, relay eNB 104 can provide UE 110 with access to the donor eNB 102. Moreover, for example, there can be multiple relay eNBs 104 between the donor eNB 102 and UE 110. Further, donor eNB 102 can be a macrocell access point, femtocell access point, picocell access point, mobile base station, and/or the like, as described. Relay eNB 104 can similarly be a mobile or stationary relay node that communicates with donor eNB 102 over a wireless or wired backhaul, as described.

In the depicted example, UE 110 can transmit measurement reports 702 to relay eNB 104 that can include one or more communications metrics related to one or more surrounding eNBs (e.g., SNR and/or the like). Relay eNB 104 can make a handover decision 704 to initiate a handover procedure based at least in part on the measurement reports (e.g., where donor eNB 102 has a more desirable SNR or other communication metric, desired services, and/or the like). In this example, relay eNB 104 determines to handover UE 110 to donor eNB 102 and transmits a handover request—R 706 to the donor eNB 102 (e.g., through one or more other relay eNBs or otherwise). The handover request—R 706 can be defined for relay application protocol (RAPP) communications, which can be a protocol defined for communicating between relay nodes without interrupting or processing an application layer payload. Thus, for example, handover request—R 706 and can be similar to a handover request message in an X2 interface additionally including information regarding relay radio bearer IDs to be setup, RRC context information, control plane security information, etc. In this regard, handover request—R 706 can have a format similar to the following:

| IE/Group Name |
|---|
| Message Type |
| Transaction ID |
| Cause |
| Target Cell ID |
| UE Context Information |
| > Aggregate Maximum Bit Rate |
| > Subscriber Profile ID for RAT/Frequency priority |
| >SAE Bearers To Be Setup List |
| >>SAE Bearer Info |
| >>>Relay Radio Bearer ID |
| >>> SAE Bearer ID |
| >>> SAE Bearer Level QoS Parameters |
| > RRC Context |
| >Handover Restriction List |
| >Location Reporting Information |

-continued

| IE/Group Name |
| --- |
| Control Plane Security Information |
| UE History Information |
| Trace Activation |

Thus, for example, the relay radio bearer IDs can relate to relay radio bearers established with UE 110, as described previously. In addition, control plane security information can relate to one or more parameters for decrypting UE 110 communications in the control plane. The transaction ID can be assigned by relay eNB 104 as a reference for a subsequent communication.

Donor eNB 102 can perform admission control 708, which can include determining allocation of bandwidth among bearers or other streams for communicating with donor eNB 102. Donor eNB 102 can the transmit a handover request acknowledgment (ACK)—R 710 to relay eNB 104, which again can be a message defined for RAPP communications. For example, the handover request ACK—R 710 can have a format similar to the following:

| IE/Group Name |
| --- |
| Message Type |
| Transaction ID |
| Relay UE ID |
| SAE Bearers Admitted List |
| > SAE Bearer Info |
| >>Relay Radio Bearer ID |
| >> SAE Bearer ID |
| SAE Bearers Not Admitted List |
| > SAE Bearer Info |
| >>Relay Radio Bearer ID |
| >> SAE Bearer ID |
| >> Cause |
| Target eNB To Source eNB Transparent Container |
| Criticality Diagnostics |

Thus, handover request ACK—R 710 can be similar to a handover request ACK in X2 additionally including a transaction ID (e.g., the transaction ID from the handover request—R 706), a relay UE ID, and relay radio bearer IDs for bearers established at donor eNB 102 (and/or bearers not established at donor eNB 102). Relay eNB 104 can transmit a handover command 712 to UE 110 to complete handover. UE 110 can detach from the old eNB (relay eNB 104) and synchronize to the new eNB (donor eNB 102) 714, and UE 110 can transmit a handover confirm 716 to donor eNB 102 to complete handover thereto.

Figure 8:
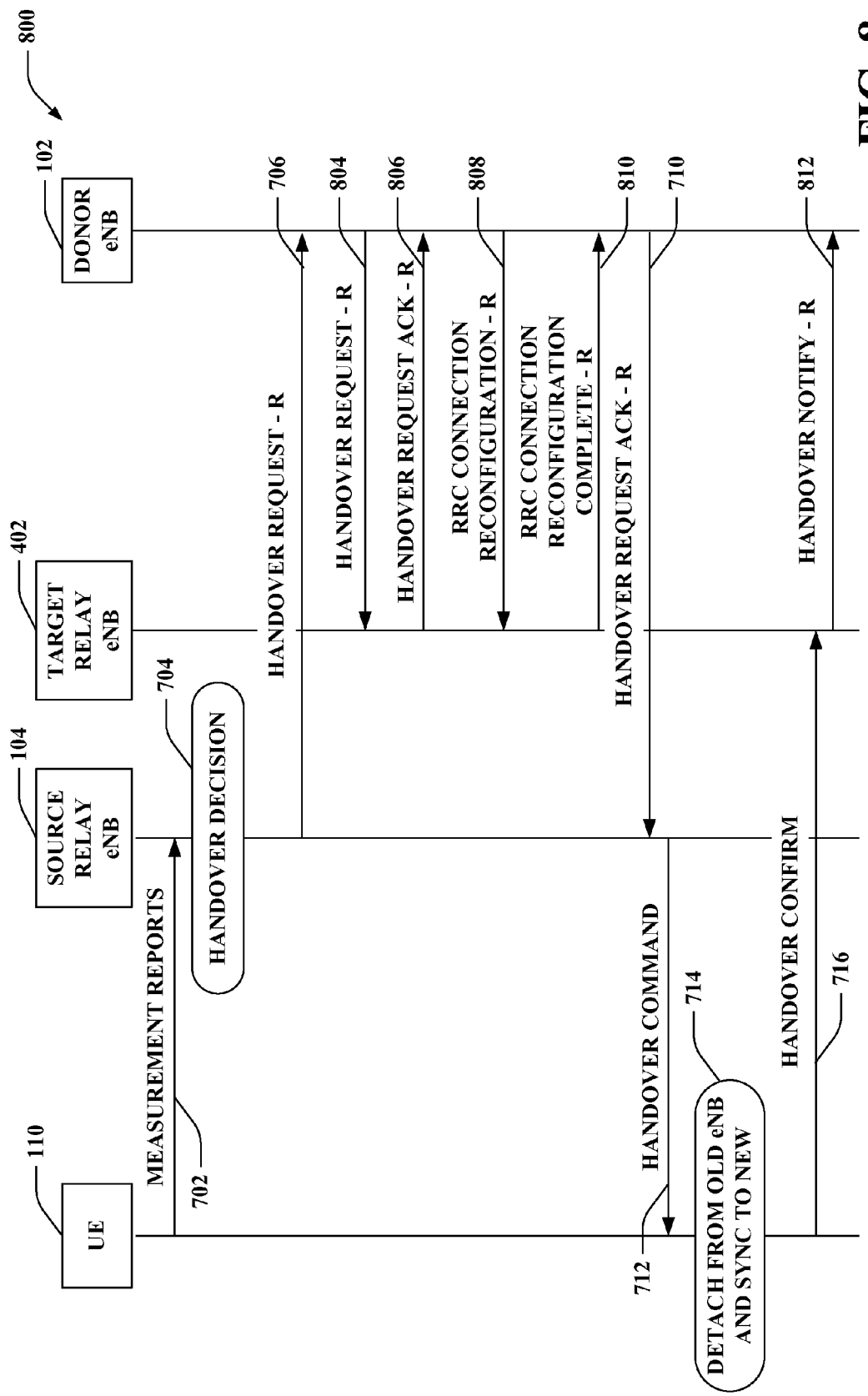
FIG. 8 is an illustration of an example wireless communications system that facilitates intra-cluster handover of a UE to a relay eNB.

Turning to FIG. 8, an example wireless communication system 800 is illustrated that facilitates intra-cluster handover for a UE to a disparate relay eNB. System 800 includes a donor eNB 102 that provides source relay eNB 104 and target relay eNB 402 (and/or other relay eNBs) with access to a core network (not shown). Additionally, as described, source relay eNB 104 can provide UE 110 with access to the donor eNB 102. Moreover, for example, there can be multiple relay eNBs between the donor eNB 102 and UE 110. Further, donor eNB 102 can be a macrocell access point, femtocell access point, picocell access point, mobile base station, and/or the like, as described. Source relay eNB 104 and target relay eNB 402 can similarly be mobile or stationary relay nodes that communicate with donor eNB 102 over a wireless or wired backhaul, as described.

In the depicted example, UE 110 can transmit measurement reports 702 to source relay eNB 104 that can include one or more communications metrics related to one or more surrounding eNBs (e.g., SNR and/or the like), such as target relay eNB 402. Source relay eNB 104 can make a handover decision 704 to initiate a handover procedure based at least in part on the measurement reports (e.g., where target relay eNB 402 has a more desirable SNR or other communication metric, desired services, and/or the like). In this example, source relay eNB 104 determines to handover UE 110 to target relay eNB 402, which is in the same cluster as source relay eNB 104, and transmits a handover request—R 706 to the donor eNB 102 (e.g., through one or more other relay eNBs or otherwise), as described above.

Donor eNB 102 can transmit a handover request—R 804 to target relay eNB 402—this can be the same as handover request—R 708. Target relay eNB 402 can similarly attempt to setup one or more bearers corresponding to the relay radio bearer IDs in the handover request—R 804 and can transmit a handover request ACK—R 806, as described, indicating the bearers setup (and/or one or more bearers not setup). Donor eNB 102 can transmit an RRC connection reconfiguration—R 808, as described, to initialize the one or more radio bearers, and target relay eNB 402 can transmit an RRC connection reconfiguration complete—R 810 indicating the radio bearers successfully initialized. Donor eNB 102 can subsequently transmit a handover request ACK—R 810 to source relay eNB 104, as described previously, to indicate acknowledgement for handover, as well as the radio bearers setup and initialized at target relay eNB 402 for UE 110.

Source relay eNB 104 can transmit a handover command 712 to UE 110 to complete handover. UE 110 can detach from the old eNB (source relay eNB 104) and synchronize to the new eNB (target relay eNB 402) 714, and UE 110 can transmit a handover confirm 716 to target relay eNB 402 to complete handover thereto. Target relay eNB 402 can additionally notify donor eNB 102 of the handover using a handover notify—R 812. The handover notify—R 812 can be defined for RAPP communications and can be similar to a handover notify in X2 additionally including a relay UE ID related to UE 110 and target relay eNB 402 (and/or associated with source relay eNB 104). Handover notify—R 812 can have a format similar to the following:

| IE/Group Name |
| --- |
| Message Type |
| Relay UE ID |
| E-UTRAN CGI |

Donor eNB 102 can update routing tables and/or other structures that utilize the relay UE ID for routing packets to UE 110 to include the relay UE ID specified in the handover notify—R 812, for example.

Figure 9:
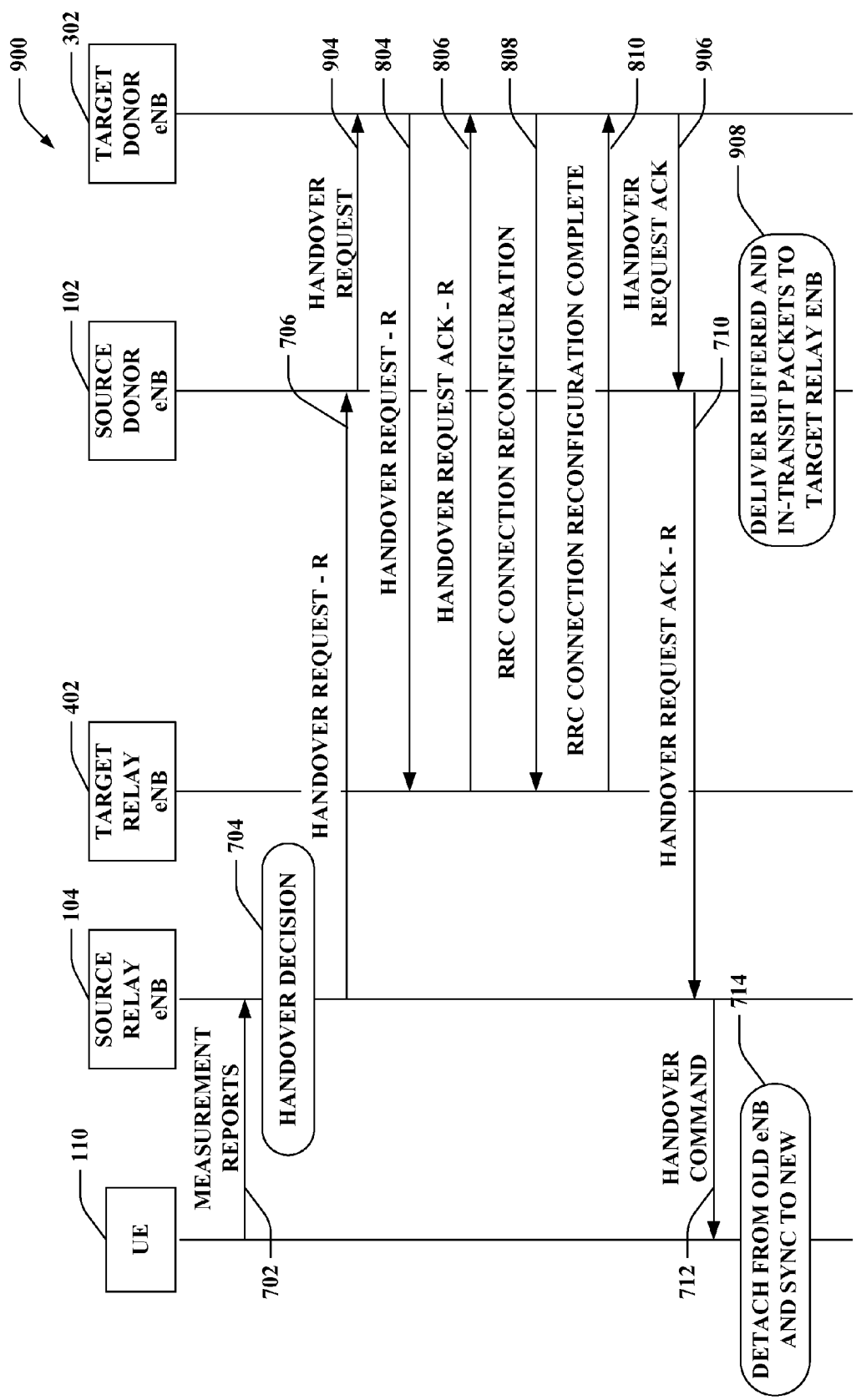
FIG. 9 is an illustration of an example wireless communications system that facilitates inter-cluster handover of a UE.
Figure 10:
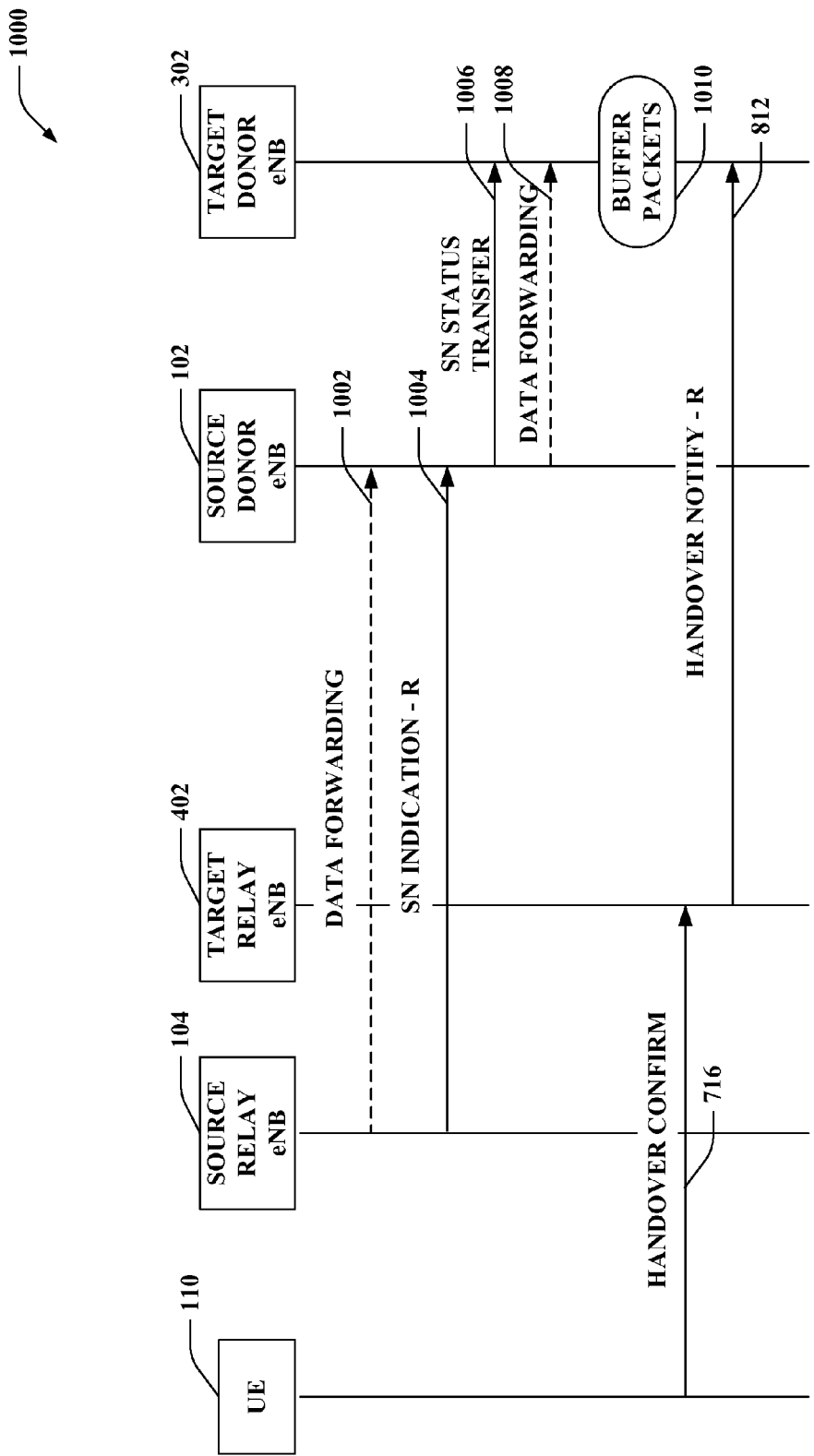
FIG. 10 is an illustration of an example wireless communications system that provides context information during inter-cluster handover of a UE.

Referring now to FIGS. 9-10, example wireless communication systems 900 and 1000 are illustrated that facilitate inter-cluster handover for a UE to a disparate relay eNB or donor eNB in a disparate cluster. Systems 900 and 1000 include a source donor eNB 102 that provides source relay eNB 104 (and/or other relay eNBs) with access to a core network (not shown). Additionally, as described, source relay eNB 104 can provide UE 110 with access to the donor eNB 102. Moreover, for example, there can be multiple relay eNBs between the donor eNB 102 and UE 110. Similarly, target relay eNB 402 can communicate with target donor eNB 302 to receive and provide access to a core network. Furthermore, source donor eNB 102 and/or target donor eNB 302 can be macrocell access points, femtocell access points, picocell access points, mobile base stations, and/or the like, as described. Source relay eNB 104 and target relay eNB 402 can similarly be mobile or stationary relay nodes that communicate with donor eNB 102 over a wireless or wired backhaul, as described. In one example, FIG. 10 illustrates communications occurring among the displayed nodes as part of or subsequent to the handover procedure of in FIG. 9.

In FIG. 9, UE 110 can transmit measurement reports 702 to source relay eNB 104 that can include one or more communications metrics related to one or more surrounding eNBs (e.g., SNR and/or the like), such as target relay eNB 402. Source relay eNB 104 can make a handover decision 704 to initiate a handover procedure based at least in part on the measurement reports (e.g., where target relay eNB 402 has a more desirable SNR or other communication metric, desired services, and/or the like). In this example, source relay eNB 104 determines to handover UE 110 to target relay eNB 402, which is served by target donor eNB 302, and transmits a handover request—R 706 to source donor eNB 102 (e.g., through one or more other relay eNBs or otherwise), as described above. For example, handover request—R 706 can be similar to a handover request in X2 but excluding security parameters.

Source donor eNB 102 can transmit a handover request 904 to target donor eNB 302, which can relate to an X2 message, as described previously. In this regard, source donor eNB 102 converts the handover request—R 706 to the handover request 904, which can include replacing a relay UE ID field with an eNB UE S1AP ID or similar value, as described. Moreover, source donor eNB 102 can include a security key (e.g., KeNB) for interpreting secured communications from UE 110 in the handover request 904. In addition, one or more relay radio bearers IDs can be removed from the handover request—R 706, to create handover request 904, and replaced by transport layer addresses, GTP TEIDs, and/or the like, as described.

In another example, an S1 protocol can be utilized to communicate between source donor eNB 102 and target donor eNB 302 (e.g., where X2 is not available), in which case donor eNB 102 can transmit the handover request 904 to one or more components of a core network (not shown) for providing to target donor eNB 302. In this example, handover request 904 can be defined for use with S1 and can include similar parameters as the handover request 904 in X2. Furthermore, one or more core network components for target donor eNB 302 (e.g., an MME, SGW, PGW, etc.) can additionally establish SAE bearers as defined in the handover request 904 for UE 110. In either case, target donor eNB 302 can generate a handover request—R 804 for transmitting to target relay eNB 402 (e.g., through one or more intermediary relay eNBs or otherwise), which can again be similar to handover request 904 with additional or excluded fields related to the RAPP definition of handover request—R 804. In addition, target donor eNB 302 can calculate a security key (e.g., RRC key) and include the key in handover request—R 804 (e.g., as part of the control plane security information, as described above).

Target relay eNB 402 can attempt to setup one or more radio bearers corresponding to the relay radio bearer IDs in the handover request—R 804 and can transmit a handover request ACK—R 806, as described, indicating the radio bearers setup (and/or one or more radio bearers not setup) to target donor eNB 302. The handover request ACK—R 806 can additionally include a transaction ID indicated in handover request—R 804 and an assigned relay UE ID for UE 110. Target donor eNB 302 can transmit an RRC connection reconfiguration—R 808, as described, to initialize the one or more radio bearers, as described, and target relay eNB 402 can transmit an RRC connection reconfiguration complete—R 810 indicating the radio bearers successfully initialized. Target donor eNB 302 can subsequently transmit a handover request ACK to source donor eNB 102, over an X2 or S1 interface, as described above. Source donor eNB 102 can transmit a handover request ACK—R 810 to source relay eNB 104, as described previously, to indicate acknowledgement for handover as well as the bearers setup and initialized at target relay eNB 402 for UE 110.

Source relay eNB 104 can transmit a handover command 712 to UE 110 to complete handover. UE 110 can detach from the old eNB (source relay eNB 104) and synchronize to the new eNB (target relay eNB 402) 714. Source donor eNB 102 can deliver buffered and in-transit packets to target relay eNB 402 908. In this regard, target relay eNB 402 can receive the buffered and in-transit packets for effectively continuing communications with UE 110.

In FIG. 10, once UE 110 has been handed over to target relay eNB 402, source relay eNB 104 can perform data forwarding 1002 to source donor eNB 102, which includes providing UL packets in the UL receive buffer of source relay eNB 104. In addition, source relay eNB 104 can transmit a sequence number (SN) indication—R 1004 to source donor eNB 102, which can be defined in RAPP for communicating information about served UEs, such as SN status for given bearers in the source relay eNB 104, to facilitate handover thereof. For example, SN indication—R 1004 can be similar to SN indication in X2 defined for transferring contexts for handover additionally including a relay UE ID and one or more relay radio bearer IDs. For example, SN indication—R 1004 can have a format similar to the following:

| IE/Group Name |
| --- |
| Message Type |
| UE List |
| > UE Item |
| >>Relay UE ID |
| >>SAE Bearers Subject To Status Transfer List |
| >>>SAE Bearers Subject To Status Transfer Item |
| >>>> Relay Radio Bearer ID |
| >>>> SAE Bearer ID |
| >>>> DL COUNT Value |

The DL COUNT value, for example, can relate to a sequence number the target relay eNB 402 should assign to the next DL (SDU) not having an SN (e.g., the last successfully transmitted DL PDCP SN related to the corresponding SAE bearer). Source donor eNB 102, upon receiving the SN indication—R 1004, can generate and transmit an SN status transfer to target donor eNB 302 to provide information regarding communicating with one or more UEs being handed over.

It is to be appreciated, as described, that source donor eNB 102 can provide the SN status transfer 1006 directly to target donor eNB 302 over X2 or through a core network utilizing S1. In addition, source donor eNB 102 can perform data forwarding 1008 to target donor eNB 302 to provide the UL packets in the receive buffer of source relay eNB 104. UE 110 can transmit a handover confirm 716 to target relay eNB 402 to complete handover thereto. Target relay eNB 402 can additionally notify target donor eNB 302 of the handover using a handover notify—R 812, as described. Target donor eNB 302 can update routing tables and/or other structures that utilize the relay UE ID for routing packets to UE 110 to include the relay UE ID specified in the handover notify—R 812, for example. In addition, target donor eNB 302 can begin forwarding the UL data received in data forwarding 1008 to target relay eNB 402 for providing to UE 110, as described. Similarly, UE 110 can begin transmitting UL data to target relay eNB 402 for forwarding to target donor eNB 302, as described. In addition, for example, target relay eNB 402 can utilize the security key received in the handover request 904 (shown in FIG. 9) for communicating with UE 110.

Figure 11:
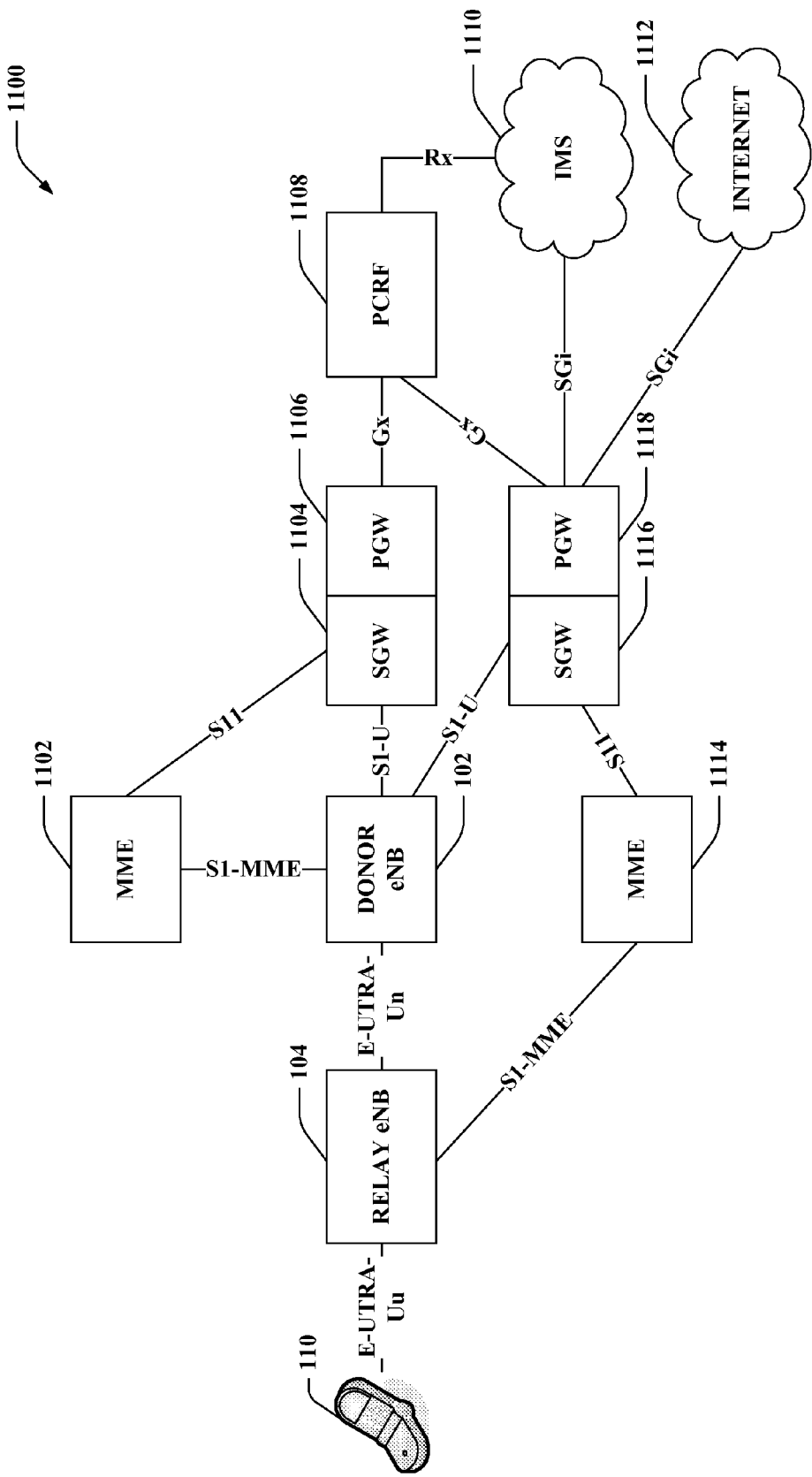
FIG. 11 is an illustration of an example wireless communications system that utilizes cell relays to provide access to a wireless network.

Now turning to FIG. 11, an example wireless communication network 1100 that provides split-cell relay functionality is depicted. Network 1100 includes a UE 110 that communicates with a relay eNB 104, as described, to receive access to a wireless network. Relay eNB 104 can communicate with a donor eNB 102 to provide access to a wireless network, and as described, donor eNB 102 can communicate with an MME 1102 and/or SGW 1104 that relate to the relay eNB 104. SGW 1104 can connect to or be coupled with a PGW 1106, which provides network access to SGW 1104 and/or additional SGWs. PGW 1106 can communicate with a PCRF 1108 to authenticate/authorize UE 110 to use the network, which can utilize an IMS 1110 to provide addressing to the UE 110 and/or relay eNB 104.

According to an example, MME 1102 and/or SGW 1104 and PGW 1106 can be related to donor eNB 102 serving substantially all relay eNBs in the cluster. Donor eNB 102 can also communicate with an SGW 1116 and PGW 1118 that relate to the UE 110, such that the PGW 1118 can assign UE 110 a network address to facilitate tunneling communications thereto through the relay eNB 104, donor eNB 102, and SGW 1116. Moreover, for example, SGW 1116 can communicate with an MME 1114 to facilitate control plane communications to and from the UE 110. It is to be appreciated that MME 1102 and MME 1114 can be the same MME, in one example. PGW 1118 can similarly communicate with a PCRF 1108 to authenticate/authorize UE 110, which can communicate with an IMS 1110. In addition, PGW 1118 can communicate directly with the IMS 1110 and/or internet 1112.

In an example, UE 110 can communicate with the relay eNB 104 over one or more radio protocol interfaces, such as an E-UTRA-Uu interface, as described, and the relay eNB 104 can communicate with the donor eNB 102 using one or more radio protocol interfaces, such as an E-UTRA-Un or other interface. As described, relay eNB 104 can leave a PDCP layer of packets from UE 110 intact, while retrieving one or more parameters from the PDCP header. In this regard, encryption/decryption, security, and or other procedures can be performed by UE 110 and donor eNB 102, such that relay eNB 104 does not need to perform such tasks.

In addition, as described, relay eNB 104 can translate control data packets received from UE 110 to RAPP layer packets for routing to donor eNB 102 through potentially one or more additional relay eNBs (not shown). Donor eNB 102 communicates with the MME 1102 using an S1-MME interface and the SGW 1104 and PGW 1106 over an S1-U interface, as depicted. The transport and/or application layers used over the S1-MME and S1-U interfaces are terminated at the donor eNB 102, as described. In this regard, upon receiving communications for the relay eNB 104 from the MME 1102 or SGW 1104, donor eNB 102 decouples upper layers from the transport and/or application layer by defining a new transport and/or application layer packet and transmitting the upper layer communication to the relay eNB 104 in the new transport/application layer packet (over the E-UTRA-Un interface, in one example).

Upon transmitting control plane communications from the relay eNB 104 to the MME 1102, donor eNB 102 can indicate an identifier of the relay eNB 104 (e.g., in an S1-AP message), and MME 1102 can transmit the identifier in responding communications to the donor eNB 102. In one example described previously, donor eNB 102 can determine the identifier based on a relay UE identifier received from relay eNB 104 in the control plane communications (e.g., as a RAPP layer parameter). In an example, donor eNB 102 can insert the determined identifier in the TEID of a GTP-U header, etc. SGW 1104 can transmit the TEID in a responding GTP-U header such that donor eNB 102 can determine the relay eNB 104, or one or more downstream relay eNBs, is to receive the translated packet, as described above. For example, this can be based at least in part on locating at least a portion of the TEID in a routing table at donor eNB 102 associated with the relay UE identifier.

Thus, upon receiving a packet from SGW 1104 (or SGW 1116), donor eNB 102 can determine a relay UE identifier related to the packet (e.g., from a routing table), create a disparate packet with a RAPP layer including the relay UE identifier, and transmit the disparate packet to the appropriate relay eNB, which can be relay eNB 104 in this example. Relay eNB 104 can accordingly translate the RAPP layer to an application layer of a disparate packet for transmitting to UE 110 based on the relay UE identifier, as described. These foregoing functionalities can mitigate the need for user datagram protocol (UDP)/internet protocol (IP) routing on the backhaul link between various eNBs, for example. In addition, headers can be compressed between donor eNB 102 and UE 110, in one example, as described. As shown, MME 1102 can communicate with SGW 1104, and MME 1114 to SGW 1116, using an S11 interface. PGWs 1106 and 1118 can communicate with PCRF 1108 over a Gx interface. Furthermore, PCRF 1108 can communicate with IMS 1110 using an Rx interface, and PGW 1118 can communicate with IMS 1110 and/or the internet 1112 using an SGi interface.

Referring to FIGS. 12-17, methodologies relating to facilitating mobility using split-cell relays are illustrated. While, for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 12:
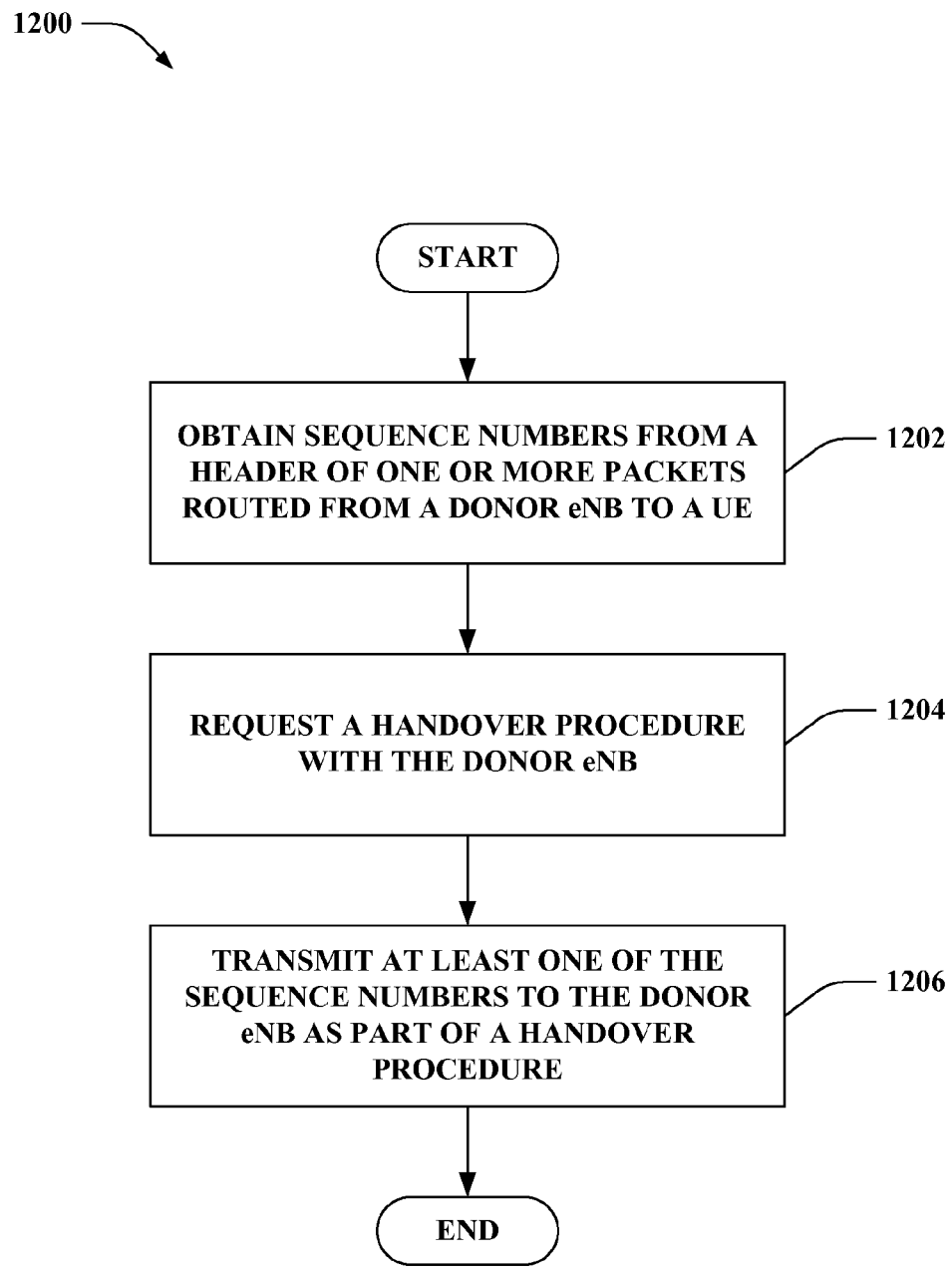
FIG. 12 is an illustration of an example methodology for providing sequence numbers to one or more donor eNBs to facilitate handover of a UE.

Turning to FIG. 12, an example methodology 1200 that facilitates providing information regarding communicating with a UE to a donor eNB during a handover procedure is illustrated. At 1202, sequence numbers can be obtained from a header of one or more packets routed from a donor eNB to a UE. As described, for example, the sequence numbers can be obtained from a PDCP header. In addition, the sequence numbers can be stored with a PDCP context associated with the UE. At 1204, a handover procedure can be requested with the donor eNB. For example, the handover procedure can relate to handing over the UE to a target relay eNB, which can be served by the donor eNB or a disparate donor eNB, handing over to a disparate donor eNB, and/or the like. At 1206, at least one of the sequence numbers can be transmitted to the donor eNB as part of a handover procedure. Thus, for example, the donor eNB can continue communications to the UE through a relay eNB beginning with a packet corresponding to the next sequence number, as described.

Figure 13:
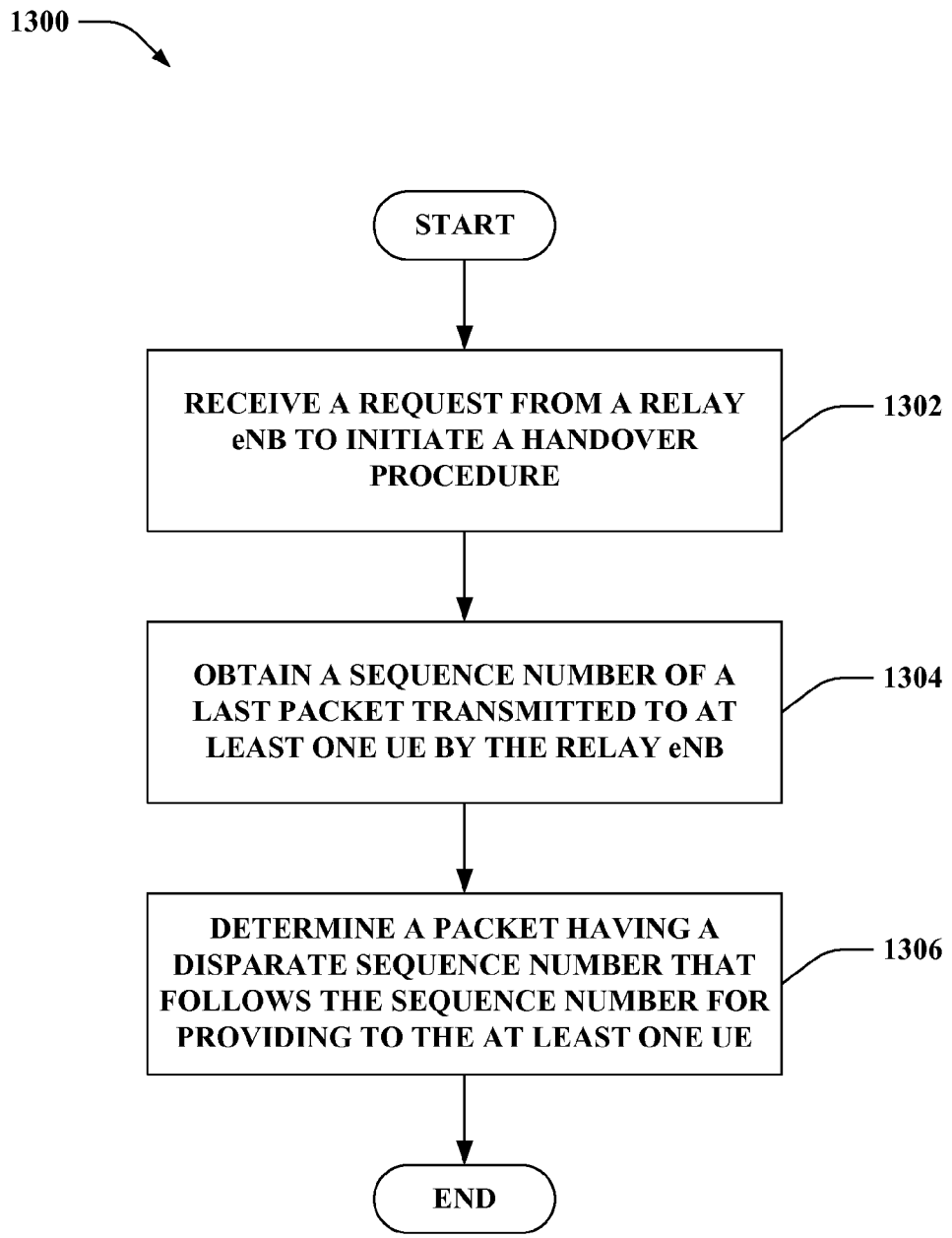
FIG. 13 is an illustration of an example methodology that receives a sequence number for providing packets to a UE as part of a handover procedure.

Referring to FIG. 13, an example methodology 1300 is shown that facilitates determining packets for communicating to a UE during and/or following a handover procedure. At 1302, a request can be received from a relay eNB to initiate a handover procedure. As described, the handover procedure can relate to handing over a UE from the relay eNB to a disparate eNB, handing over the relay eNB to a disparate donor eNB, and/or the like. At 1304, a sequence number of a last packet transmitted to at least one UE by the relay eNB can be received. This can be received as part of a PDCP context, as described, or one or more parameters from the relay eNB. At 1306, a packet having a disparate sequence number that follows the sequence number can be determined for providing to the at least one UE. In this regard, a target eNB that receives the UE or relay eNB in the handover procedure can continue communicating to the UE (e.g., via the relay eNB or otherwise) based on a next packet according to the sequence number.

Figure 14:
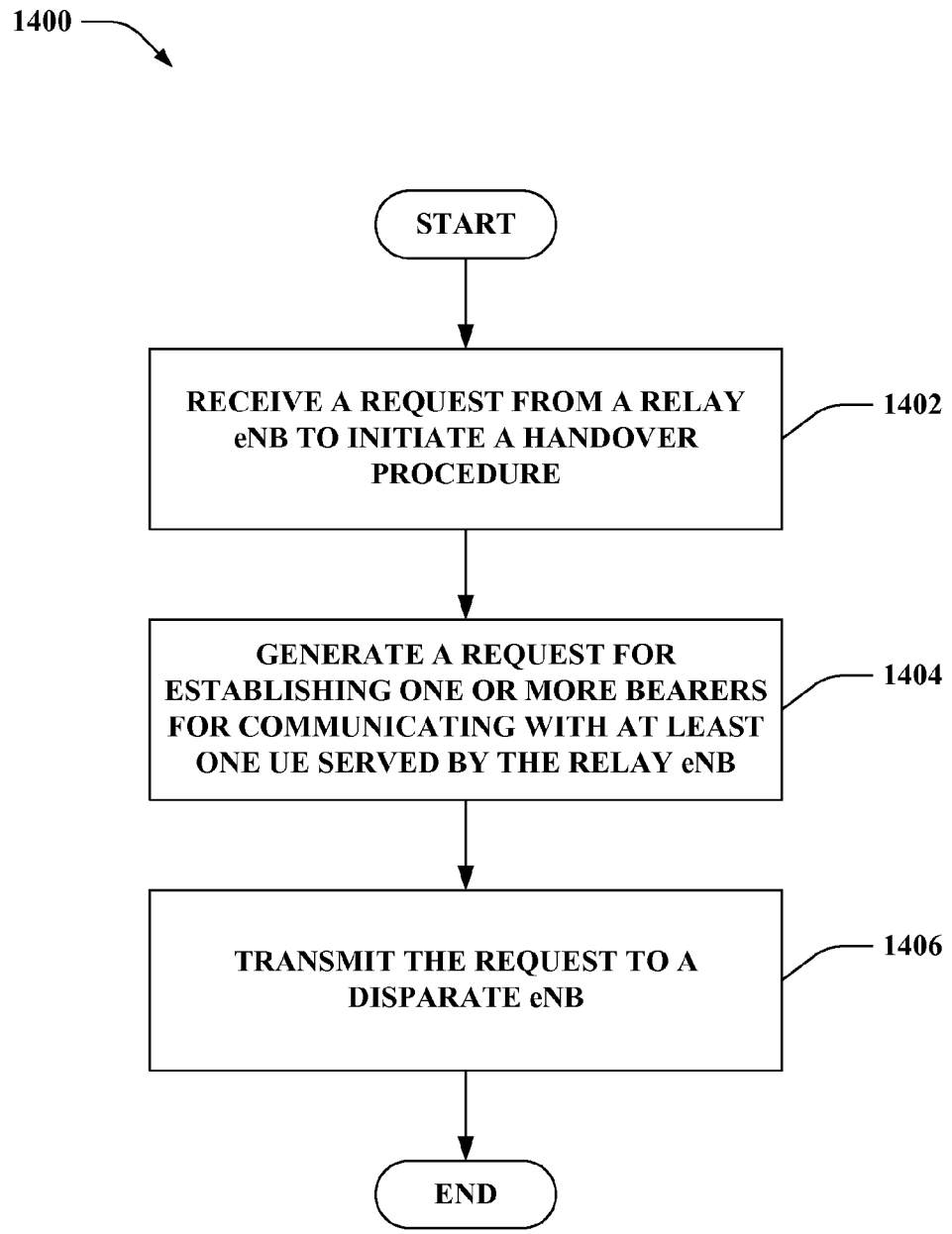
FIG. 14 is an illustration of an example methodology that communicates a request to establish one or more bearers to an eNB for communicating with a UE.

Turning to FIG. 14, an example methodology 1400 that facilitates requesting establishment of one or more radio bearers from a relay eNB as part of a handover procedure is illustrated. At 1402, a request can be received from a relay eNB to initiate a handover procedure. As described, the handover procedure can relate to handing over a UE to a target relay eNB served by a disparate donor eNB (or the disparate donor eNB itself). At 1404, a request can be generated for establishing one or more bearers for communicating with the at least one UE served by the relay eNB. The one or more radio bearers can relate to radio bearers established by the relay eNB for communicating with the UE, one or more core network bearers established for receiving core network communications for the UE, and/or the like. At 1406, the request can be transmitted to a disparate eNB. For example, a request for establishing one or more radio bearers can be transmitted to a relay eNB or disparate donor eNB for providing to a relay eNB. A request for establishing core network bearers, as described, can be transmitted to a donor eNB. In either case, appropriate bearers can be established, as described, for communicating with the UE.

Figure 15:
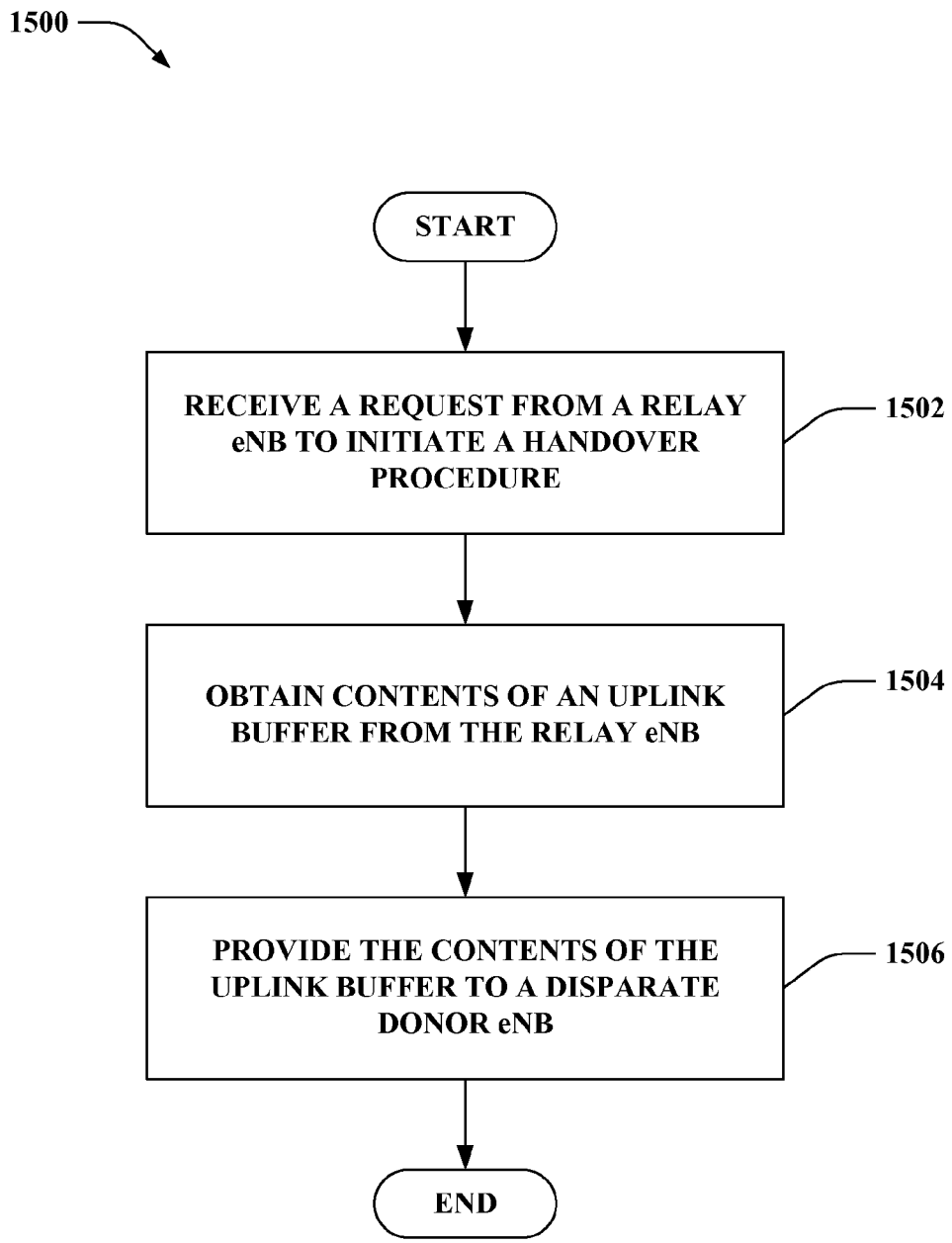
FIG. 15 is an illustration of an example methodology that communicates contents of an uplink buffer to a donor eNB for transmitting to a core network on behalf of a UE received during a handover procedure.

Referring to FIG. 15, an example methodology 1500 is shown that facilitates communicating contents of an uplink buffer during a handover procedure. At 1502, a request can be received from a relay eNB to initiate a handover procedure. As described, this can relate to handing over a relay eNB to a disparate donor eNB. At 1504, contents of an uplink buffer can be obtained from the relay eNB. The contents can relate to packets for communicating from a UE to a donor eNB. At 1506, the contents of the uplink buffer can be provided to a disparate donor eNB. In this regard, the disparate donor eNB can provide the contents to a core network and can accordingly process responding or other related packets, as described.

Figure 16:
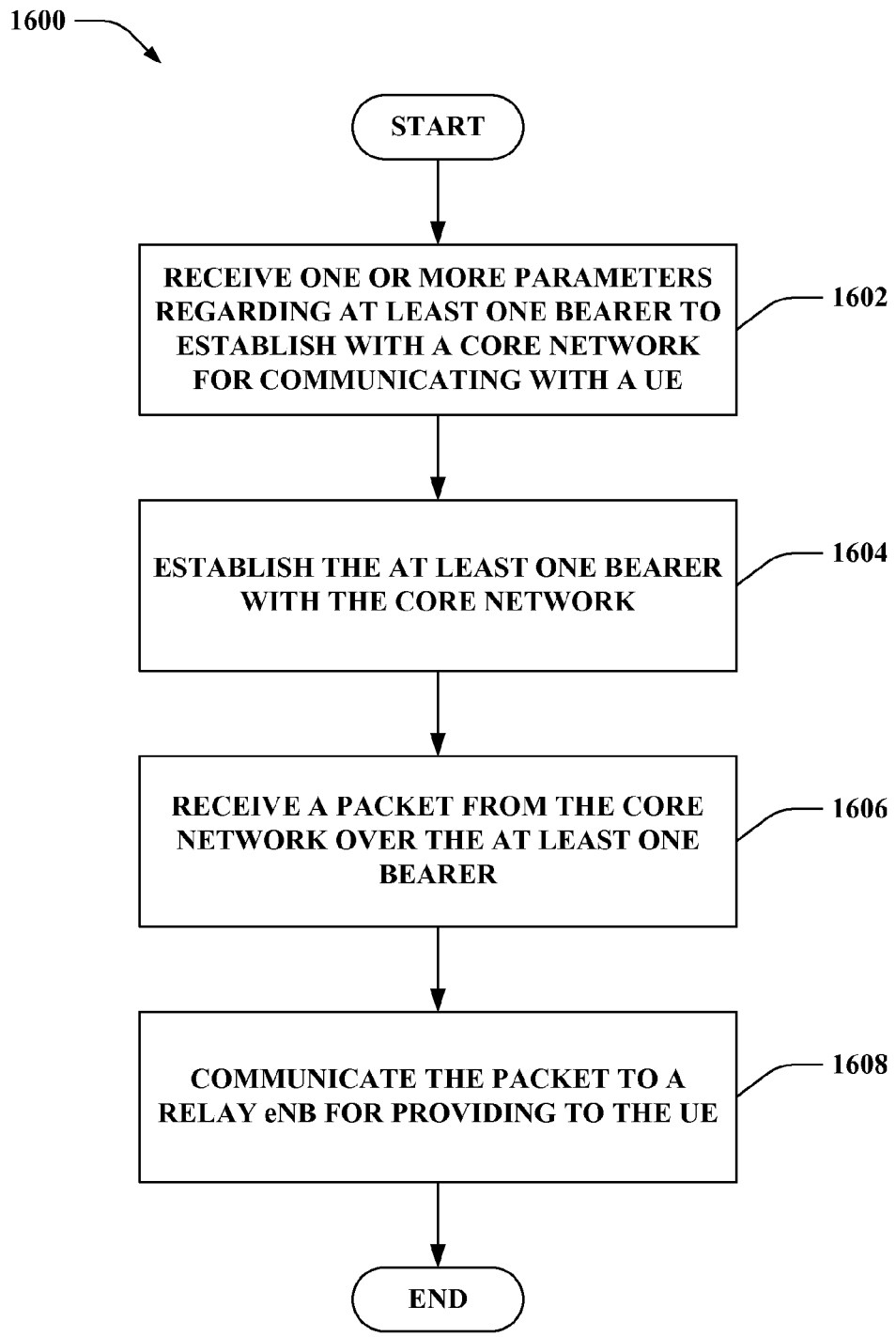
FIG. 16 is an illustration of an example methodology that establishes one or more bearers for communicating packets to a UE via a relay eNB.

Turning to FIG. 16, an example methodology 1600 that facilitates establishing bearers for communicating with a UE following a handover procedure is illustrated. At 1602, one or more parameters can be received regarding at least one bearer to establish with a core network for communicating with a UE. As described, the one or more parameters can be received from a disparate donor eNB as part of a handover procedure. For example, the bearer can have been established by the disparate donor eNB for communicating packets to the UE (e.g., via a relay eNB or otherwise). At 1604, the at least one bearer can be established with the core network. Thus, at 1606, a packet can be received from the core network over the at least one bearer. The packet can be related to the UE, as described. At 1608, the packet can be communicated to a relay eNB for providing to the UE. In addition, as described previously, one or more radio bearers can be established by the relay eNB for communicating with the UE, based on parameters received from the disparate donor eNB. The packet can be communicated to the relay eNB for providing over the one or more radio bearers (which can be identified in the packet, in one example).

Figure 17:
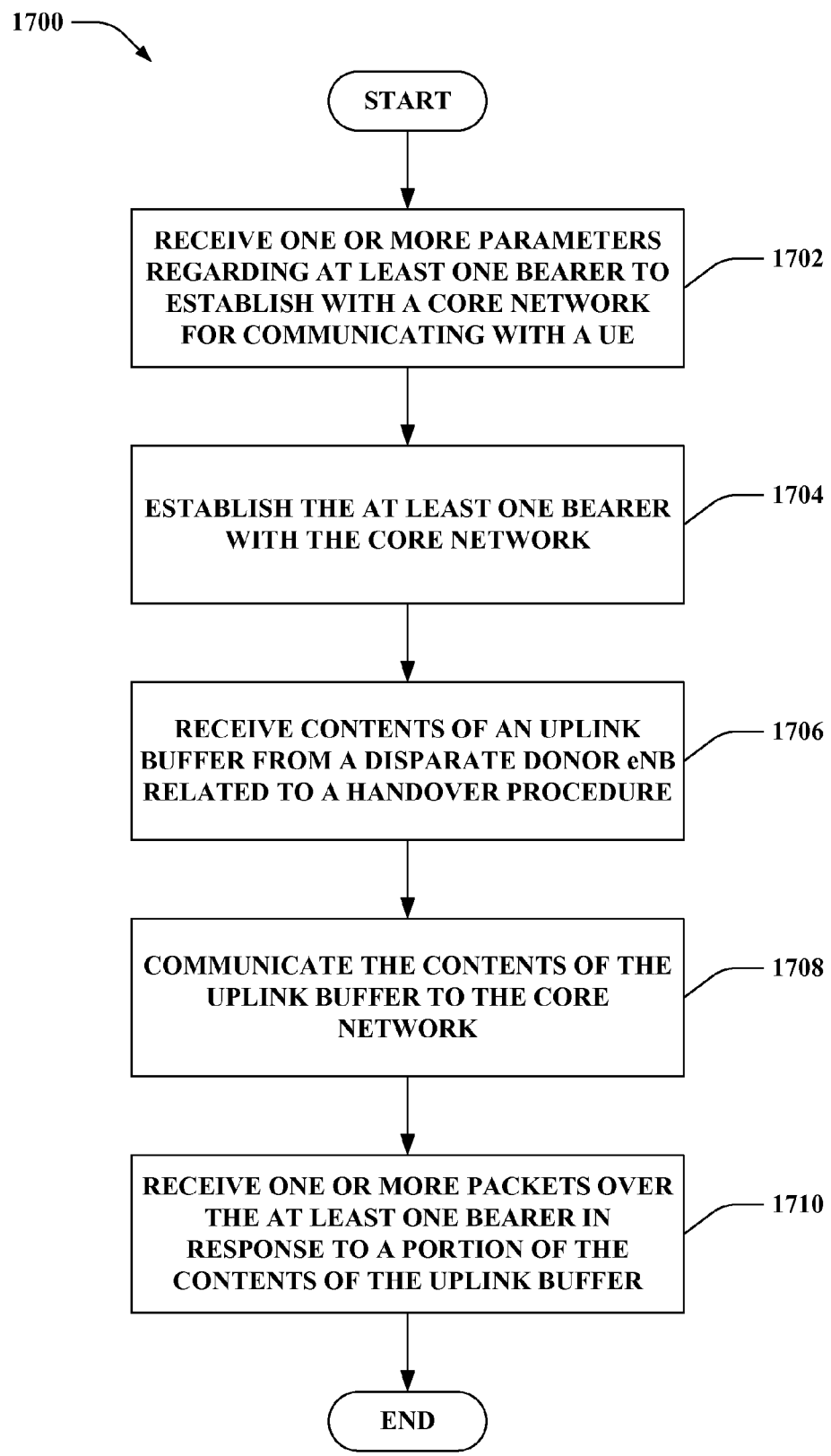
FIG. 17 is an illustration of an example methodology that establishes one or more core network bearers for communicating uplink buffer contents related to a UE.

Referring to FIG. 17, an example methodology 1700 is shown for communicating uplink buffer contents to a core network to facilitate receiving a UE in a handover procedure. At 1702, one or more parameters can be received regarding at least one bearer to establish with a core network for communicating with a UE. At 1704, as described, the at least one bearer can be established with the core network. At 1706, contents of an uplink buffer can be received from a disparate donor eNB related to a handover procedure. The contents can relate to one or more packets to transmit to core network on behalf of the UE, as described. At 1708, the contents of the uplink buffer can be communicated to the core network. Thus, at 1710, one or more packets can be received over the at least one bearer in response to a portion of the contents of the uplink buffer. As described, the one or more packets can be communicated to a relay eNB for providing to a UE.

It will be appreciated that, in accordance with one or more aspects described herein, inferences can be made regarding transmitting and receiving PDCP contexts or parameters thereof, maintaining one or more buffers for flow control, and/or other aspects described herein. As used herein, the term to "infer" or "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

Figure 18:
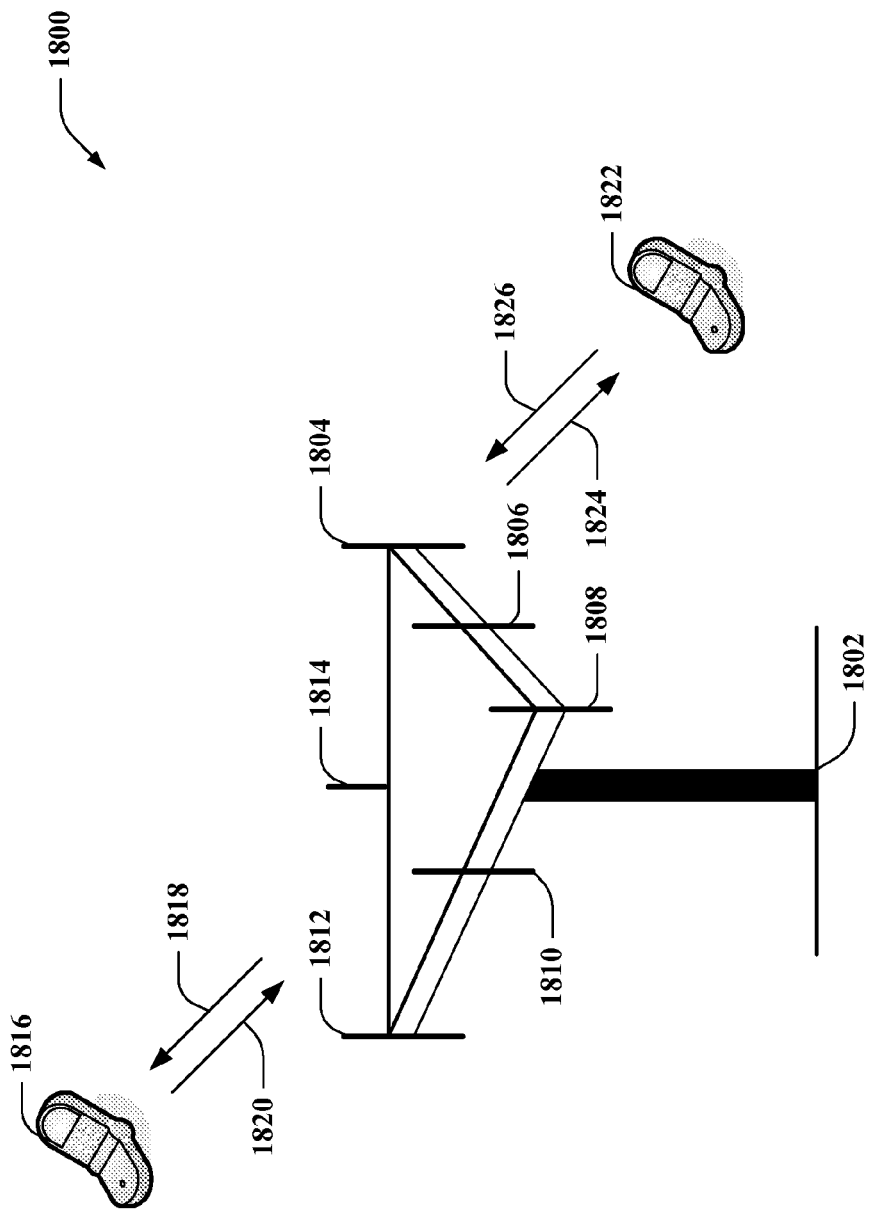
FIG. 18 is an illustration of a wireless communication system in accordance with various aspects set forth herein.

Referring now to FIG. 18, a wireless communication system 1800 is illustrated in accordance with various embodiments presented herein. System 1800 comprises a base station 1802 that can include multiple antenna groups. For example, one antenna group can include antennas 1804 and 1806, another group can comprise antennas 1808 and 1810, and an additional group can include antennas 1812 and 1814. Two antennas are illustrated for each antenna group; however, more or fewer antennas can be utilized for each group. Base station 1802 can additionally include a transmitter chain and a receiver chain, each of which can in turn comprise a plurality of components associated with signal transmission and reception (e.g., processors, modulators, multiplexers, demodulators, demultiplexers, antennas, etc.), as will be appreciated by one skilled in the art.

Base station 1802 can communicate with one or more mobile devices such as mobile device 1816 and mobile device 1822; however, it is to be appreciated that base station 1802 can communicate with substantially any number of mobile devices similar to mobile devices 1816 and 1822. Mobile devices 1816 and 1822 can be, for example, cellular phones, smart phones, laptops, handheld communication devices, handheld computing devices, satellite radios, global positioning systems, PDAs, and/or any other suitable device for communicating over wireless communication system 1800. As depicted, mobile device 1816 is in communication with antennas 1812 and 1814, where antennas 1812 and 1814 transmit information to mobile device 1816 over a forward link 1818 and receive information from mobile device 1816 over a reverse link 1820. Moreover, mobile device 1822 is in communication with antennas 1804 and 1806, where antennas 1804 and 1806 transmit information to mobile device 1822 over a forward link 1824 and receive information from mobile device 1822 over a reverse link 1826. In a frequency division duplex (FDD) system, forward link 1818 can utilize a different frequency band than that used by reverse link 1820, and forward link 1824 can employ a different frequency band than that employed by reverse link 1826, for example. Further, in a time division duplex (TDD) system, forward link 1818 and reverse link 1820 can utilize a common frequency band and forward link 1824 and reverse link 1826 can utilize a common frequency band.

Each group of antennas and/or the area in which they are designated to communicate can be referred to as a sector of base station 1802. For example, antenna groups can be designed to communicate to mobile devices in a sector of the areas covered by base station 1802. In communication over forward links 1818 and 1824, the transmitting antennas of base station 1802 can utilize beamforming to improve signal-to-noise ratio of forward links 1818 and 1824 for mobile devices 1816 and 1822. Also, while base station 1802 utilizes beamforming to transmit to mobile devices 1816 and 1822 scattered randomly through an associated coverage, mobile devices in neighboring cells can be subject to less interference as compared to a base station transmitting through a single antenna to all its mobile devices. Moreover, mobile devices 1816 and 1822 can communicate directly with one another using a peer-to-peer or ad hoc technology (not shown).

According to an example, system 1800 can be a multiple-input multiple-output (MIMO) communication system. Further, system 1800 can utilize substantially any type of duplexing technique to divide communication channels (e.g., forward link, reverse link, . . . ) such as FDD, FDM, TDD, TDM, CDM, and the like. In addition, communication channels can be orthogonalized to allow simultaneous communication with multiple devices over the channels; in one example, OFDM can be utilized in this regard. Thus, the channels can be divided into portions of frequency over a period of time. In addition, frames can be defined as the portions of frequency over a collection of time periods; thus, for example, a frame can comprise a number of OFDM symbols. The base station 1802 can communicate to the mobile devices 1816 and 1822 over the channels, which can be create for various types of data. For example, channels can be created for communicating various types of general communication data, control data (e.g., quality information for other channels, acknowledgement indicators for data received over channels, interference information, reference signals, etc.), and/or the like.

Figure 19:
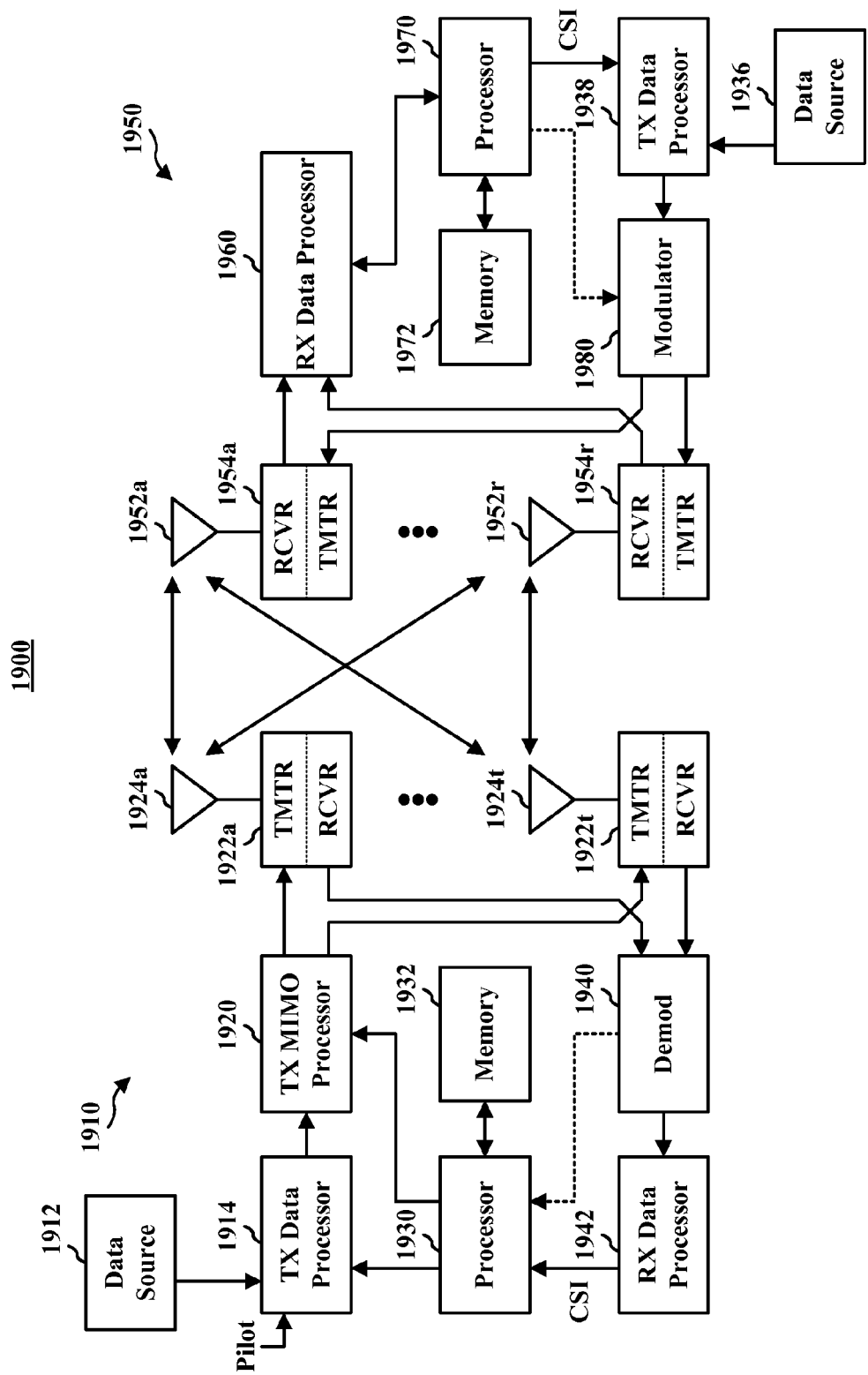
FIG. 19 is an illustration of an example wireless network environment that can be employed in conjunction with the various systems and methods described herein.

FIG. 19 shows an example wireless communication system 1900. The wireless communication system 1900 depicts one base station 1910 and one mobile device 1950 for sake of brevity. However, it is to be appreciated that system 1900 can include more than one base station and/or more than one mobile device, wherein additional base stations and/or mobile devices can be substantially similar or different from example base station 1910 and mobile device 1950 described below. In addition, it is to be appreciated that base station 1910 and/or mobile device 1950 can employ the systems (FIGS. 1-11 and 18) and/or methods (FIGS. 12-17) described herein to facilitate wireless communication therebetween.

At base station 1910, traffic data for a number of data streams is provided from a data source 1912 to a transmit (TX) data processor 1914. According to an example, each data stream can be transmitted over a respective antenna. TX data processor 1914 formats, codes, and interleaves the traffic data stream based on a particular coding scheme selected for that data stream to provide coded data.

The coded data for each data stream can be multiplexed with pilot data using orthogonal frequency division multiplexing (OFDM) techniques. Additionally or alternatively, the pilot symbols can be frequency division multiplexed (FDM), time division multiplexed (TDM), or code division multiplexed (CDM). The pilot data is typically a known data pattern that is processed in a known manner and can be used at mobile device 1950 to estimate channel response. The multiplexed pilot and coded data for each data stream can be modulated (e.g., symbol mapped) based on a particular modulation scheme (e.g., binary phase-shift keying (BPSK), quadrature phase-shift keying (QPSK), M-phase-shift keying (M-PSK), M-quadrature amplitude modulation (M-QAM), etc.) selected for that data stream to provide modulation symbols. The data rate, coding, and modulation for each data stream can be determined by instructions performed or provided by processor 1930.

The modulation symbols for the data streams can be provided to a TX MIMO processor 1920, which can further process the modulation symbols (e.g., for OFDM). TX MIMO processor 1920 then provides $N_T$ modulation symbol streams to $N_T$ transmitters (TMTR) 1922a through 1922t. In various aspects, TX MIMO processor 1920 applies beamforming weights to the symbols of the data streams and to the antenna from which the symbol is being transmitted.

Each transmitter 1922 receives and processes a respective symbol stream to provide one or more analog signals, and further conditions (e.g., amplifies, filters, and upconverts) the analog signals to provide a modulated signal suitable for transmission over the MIMO channel. Further, $N_T$ modulated signals from transmitters 1922a through 1922t are transmitted from $N_T$ antennas 1924a through 1924t, respectively.

At mobile device 1950, the transmitted modulated signals are received by $N_R$ antennas 1952a through 1952r and the received signal from each antenna 1952 is provided to a respective receiver (RCVR) 1954a through 1954r. Each receiver 1954 conditions (e.g., filters, amplifies, and down-converts) a respective signal, digitizes the conditioned signal to provide samples, and further processes the samples to provide a corresponding "received" symbol stream.

An RX data processor 1960 can receive and process the $N_R$ received symbol streams from $N_R$ receivers 1954 based on a particular receiver processing technique to provide $N_T$ "detected" symbol streams. RX data processor 1960 can demodulate, deinterleave, and decode each detected symbol stream to recover the traffic data for the data stream. The processing by RX data processor 1960 is complementary to that performed by TX MIMO processor 1920 and TX data processor 1914 at base station 1910.

A processor 1970 can periodically determine which precoding matrix to utilize as discussed above. Further, processor 1970 can formulate a reverse link message comprising a matrix index portion and a rank value portion.

The reverse link message can comprise various types of information regarding the communication link and/or the received data stream. The reverse link message can be processed by a TX data processor 1938, which also receives traffic data for a number of data streams from a data source 1936, modulated by a modulator 1980, conditioned by transmitters 1954a through 1954r, and transmitted back to base station 1910.

At base station 1910, the modulated signals from mobile device 1950 are received by antennas 1924, conditioned by receivers 1922, demodulated by a demodulator 1940, and processed by a RX data processor 1942 to extract the reverse link message transmitted by mobile device 1950. Further, processor 1930 can process the extracted message to determine which precoding matrix to use for determining the beamforming weights.

Processors 1930 and 1970 can direct (e.g., control, coordinate, manage, etc.) operation at base station 1910 and mobile device 1950, respectively. Respective processors 1930 and 1970 can be associated with memory 1932 and 1972 that store program codes and data. Processors 1930 and 1970 can also perform computations to derive frequency and impulse response estimates for the uplink and downlink, respectively.

Figure 20:
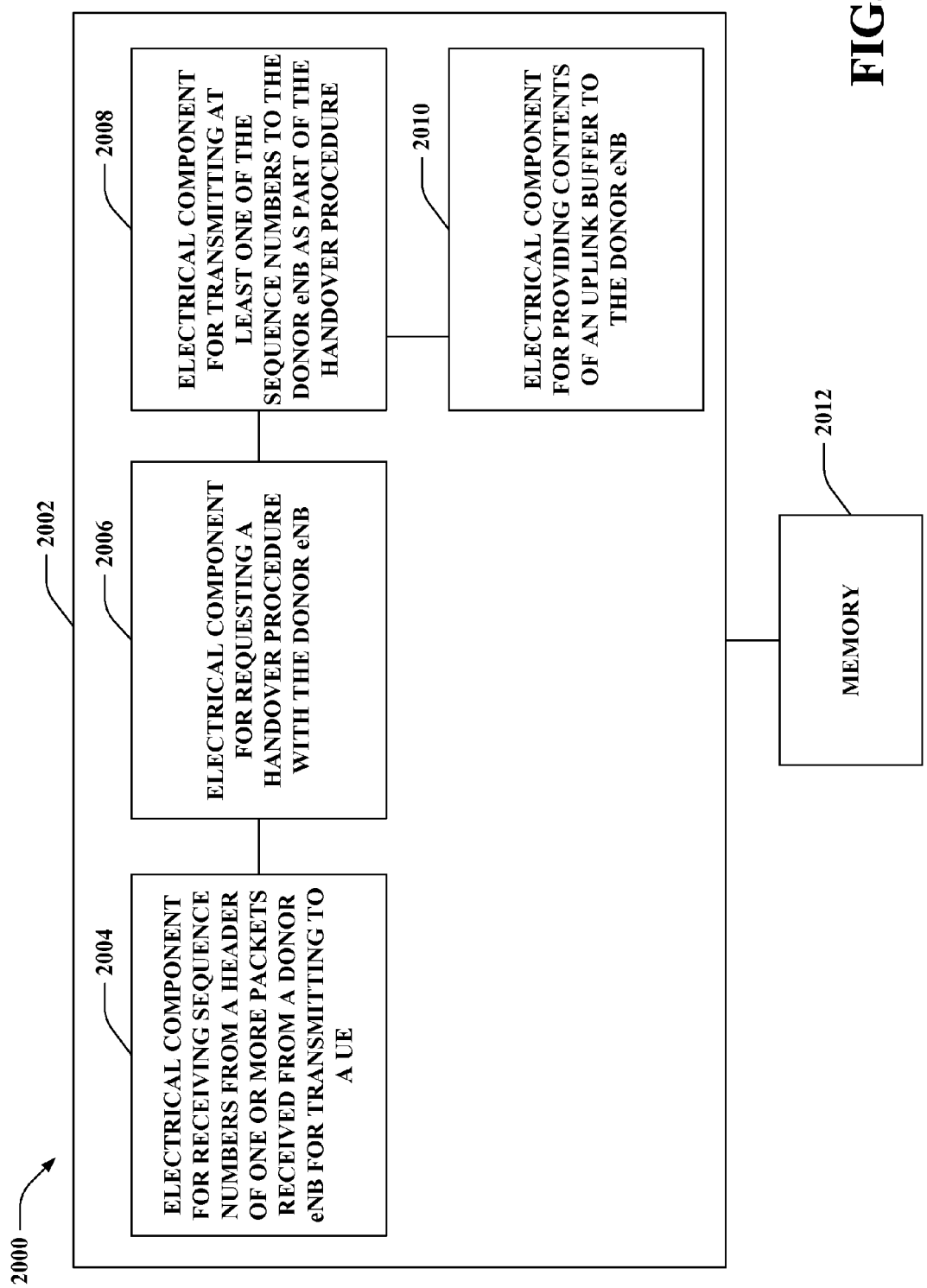
FIG. 20 is an illustration of an example system that facilitates transmitting sequence numbers to a donor eNB for communicating with a UE following handover.

With reference to FIG. 20, illustrated is a system 2000 that facilitates providing sequence numbers to a donor eNB in a handover procedure. For example, system 2000 can reside at least partially within a base station, mobile device, etc. It is to be appreciated that system 2000 is represented as including functional blocks, which can be functional blocks that represent functions implemented by a processor, software, or combination thereof (e.g., firmware). System 2000 includes a logical grouping 2002 of electrical components that can act in conjunction. For instance, logical grouping 2002 can include an electrical component for receiving sequence numbers from a header of one or more packets received from a donor eNB for transmitting to a UE 2004. As described, receiving the parameters can include determining the parameters from a PDCP header of the one or more packets. Additionally, logical grouping 2002 can include an electrical component for requesting a handover procedure with the donor eNB 2006.

As described, the handover procedure can relate to handing over the UE to a disparate eNB, handing over to a disparate donor eNB, and/or the like. Moreover, logical grouping 2002 can include an electrical component for transmitting at least one of the sequence numbers to the donor eNB as part of the handover procedure 2008. Thus, as described, the donor eNB can transmit packets to the UE following handover (e.g., via system 2000 and/or one or more relay eNBs) using the sequence number to determine a next packet. In addition, logical grouping 2002 can include an electrical component for providing contents of an uplink buffer to the donor eNB 2010. Thus, where the handover procedure relates to handing over the UE to a disparate relay eNB served by a disparate donor eNB, as described, the uplink buffer contents can be transmitted to the disparate donor eNB for communicating to the core network. Additionally, system 2000 can include a memory 2012 that retains instructions for executing functions associated with electrical components 2004, 2006, 2008, and 2010. While shown as being external to memory 2012, it is to be understood that one or more of electrical components 2004, 2006, 2008, and 2010 can exist within memory 2012.

Figure 21:
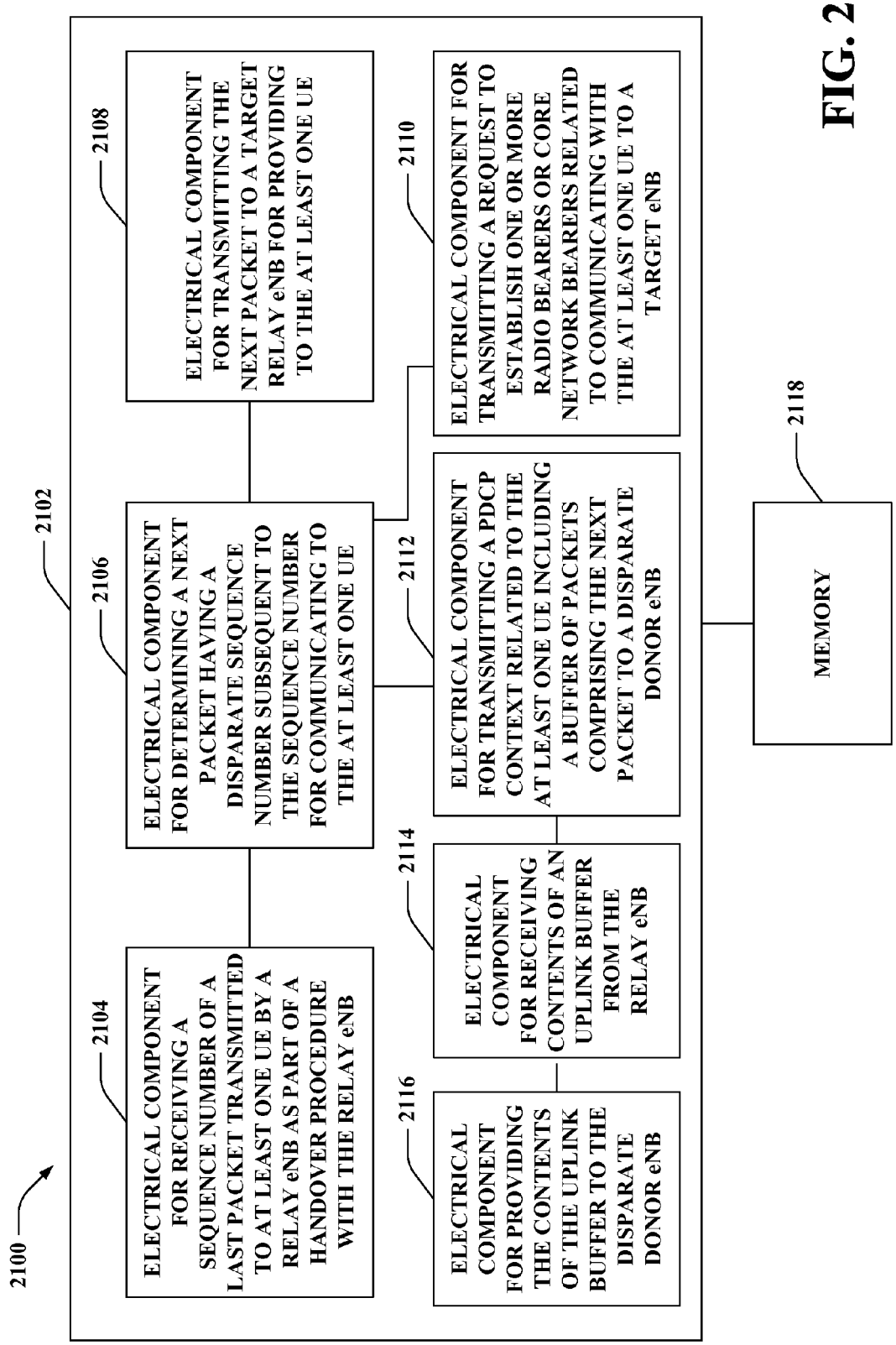
FIG. 21 is an illustration of an example system that facilitates preparing for transmitting packets to a UE following handover.

With reference to FIG. 21, illustrated is a system 2100 that facilitates preparing for transmitting packets to a UE following receiving the UE in a handover procedure. For example, system 2100 can reside at least partially within a base station, mobile device, etc. It is to be appreciated that system 2100 is represented as including functional blocks, which can be functional blocks that represent functions implemented by a processor, software, or combination thereof (e.g., firmware). System 2100 includes a logical grouping 2102 of electrical components that can act in conjunction. For instance, logical grouping 2102 can include an electrical component for receiving a sequence number of a last packet transmitted to at least one UE by a relay eNB as part of a handover procedure with the relay eNB 2104. For example, as described, the sequence number can be received with a PDCP context related to the UE, as a single PDCP parameter, and/or the like. Additionally, logical grouping 2102 can include an electrical component for determining a next packet having a disparate sequence number subsequent to the sequence number for communicating to the at least one UE 2106.

In an example, electrical component 2106 can determine the next packet from a buffer of packets received with the PDCP context, as described. Moreover, logical grouping 2102 can include an electrical component for transmitting the next packet to a target relay eNB for providing to the at least one UE 2108. In this example, the handover procedure can relate to handing over the UE to the target relay eNB. Further, for example, logical grouping 2102 can include an electrical component for transmitting a request to establish one or more radio bearers or core network bearers related to communicating with the at least one UE to a target eNB 2110. In this example, the handover procedure can additionally relate to handing over the UE to a target relay eNB served by a disparate donor eNB.

In addition, logical grouping 2102 can include an electrical component for transmitting a PDCP context related to the at least one UE including a buffer of packets comprising the next packet to a disparate donor eNB 2112. In this regard, the disparate donor eNB can communicate the packets in the buffers to a UE (e.g., via a relay eNB or otherwise), as described above. Also, logical grouping 2102 can include an electrical component for receiving contents of an uplink buffer from the relay eNB 2114 and an electrical component for providing the contents of the uplink buffer to the disparate donor eNB 2116. In this example, the handover procedure can relate to handing over a UE to a relay eNB served by a disparate donor eNB. Thus, as described, the disparate donor eNB can provide the buffer contents to the core network following handover of the UE. Additionally, system 2100 can include a memory 2118 that retains instructions for executing functions associated with electrical components 2104, 2106, 2108, 2110, 2112, 2114, and 2116. While shown as being external to memory 2118, it is to be understood that one or more of electrical components 2104, 2106, 2108, 2110, 2112, 2114, and 2116 can exist within memory 2118.

Figure 22:
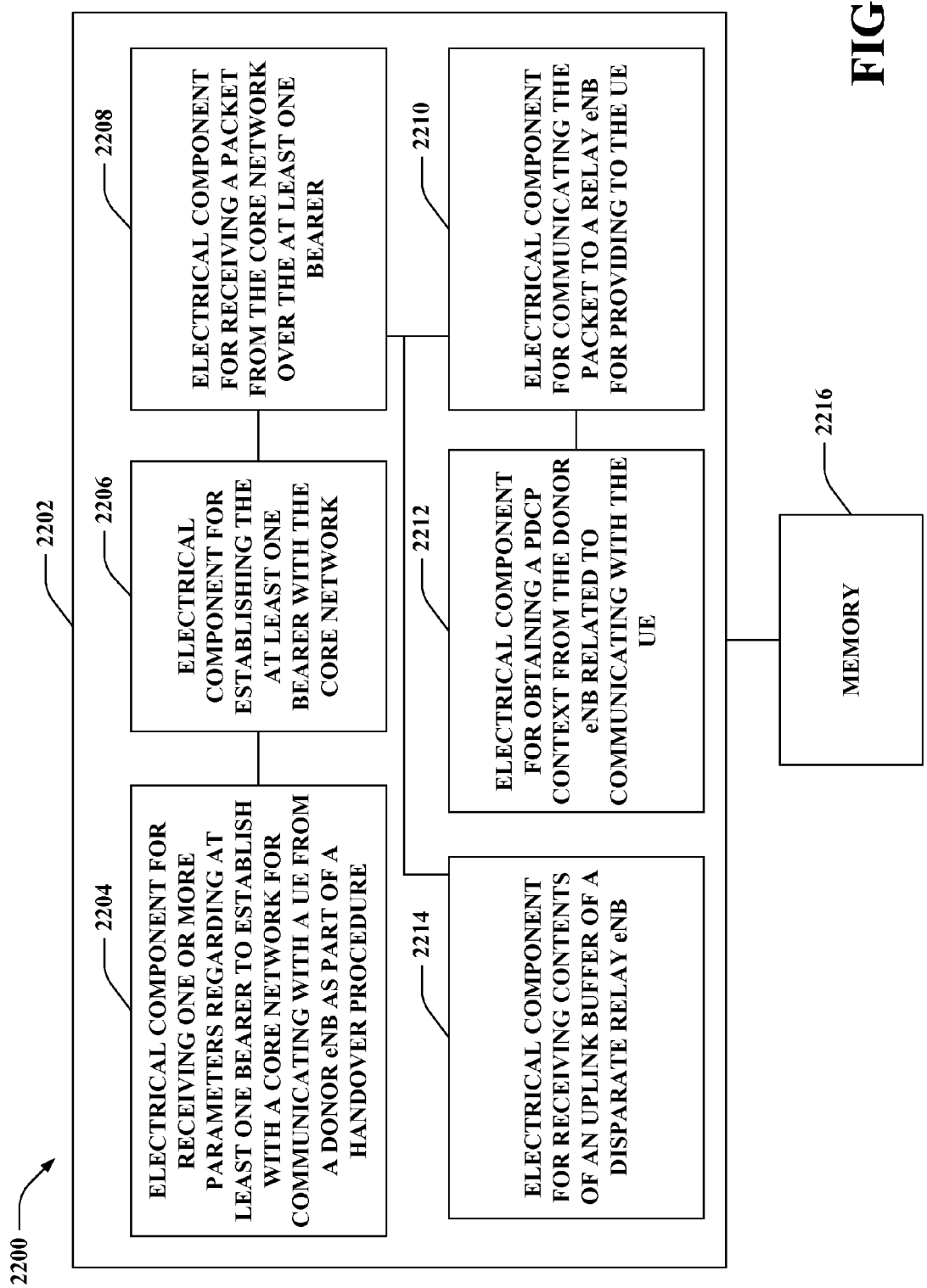
FIG. 22 is an illustration of an example system that facilitates communicating with a UE over one or more established core network bearers via one or more radio bearers established by a relay eNB.

With reference to FIG. 22, illustrated is a system 2200 that facilitates establishing bearers as part of a handover procedure to facilitate communicating with a UE. For example, system 2200 can reside at least partially within a base station, mobile device, etc. It is to be appreciated that system 2200 is represented as including functional blocks, which can be functional blocks that represent functions implemented by a processor, software, or combination thereof (e.g., firmware). System 2200 includes a logical grouping 2202 of electrical components that can act in conjunction. For instance, logical grouping 2202 can include an electrical component for receiving one or more parameters regarding at least one bearer to establish with a core network for communicating with a UE from a donor eNB as part of a handover procedure 2204. Additionally, logical grouping 2202 can include an electrical component for establishing the at least one bearer with the core network 2206.

Moreover, logical grouping 2202 can include an electrical component for receiving a packet from the core network over the at least one bearer 2208. As described, the packet can include an identifier of a relay eNB to receive the packet, an identifier of a radio bearer of the relay eNB over which to transmit the packet, and/or the like. Thus, for example, logical grouping 2202 can include an electrical component for communicating the packet to a relay eNB for providing to the UE 2210. In addition, logical grouping 2202 can include an electrical component for obtaining a PDCP context from the donor eNB related to communicating with the UE 2212. As described, for example, the PDCP context can include one or more parameters for continuing communications with the UE, such as a sequence number, a buffer of packets, and/or the like. Also, logical grouping 2202 can include an electrical component for receiving contents of an uplink buffer of a disparate relay eNB 2114. As described above, the buffer contents can relate to packets from a UE to be transmitted to a core network. Additionally, system 2200 can include a memory 2216 that retains instructions for executing functions associated with electrical components 2204, 2206, 2208, 2210, 2212, and 2214. While shown as being external to memory 2216, it is to be understood that one or more of electrical components 2204, 2206, 2208, 2210, 2212, and 2214 can exist within memory 2216.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions, procedures, etc. may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise. Furthermore, to the extent that the term "includes" is used in either the detailed description or the claims, such term is intended to be inclusive in a manner similar to the term "comprising" as "comprising" is interpreted when employed as a transitional word in a claim. Furthermore, although elements of the described aspects and/or aspects may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method, comprising:
    receiving one or more parameters regarding at least one bearer to establish with a core network for communicating with a user equipment (UE) from a donor evolved Node B (eNB) as part of a handover procedure;
    establishing the at least one bearer with the core network;
    receiving one or more disparate parameters as part of the handover procedure regarding at least one radio bearer to establish for communicating with the UE from the donor eNB;
    transmitting a request to establish the at least one radio bearer to a relay eNB based at least in part on the one or more disparate parameters;
    receiving a packet from the core network over the at least one bearer; and
    communicating the packet to the relay eNB for providing to the UE.

2. The method of claim 1, further comprising indicating an identifier of the at least one radio bearer in the packet.

3. The method of claim 2, further comprising:
obtaining a packet data convergence protocol (PDCP) context from the donor eNB related to communicating with the UE; and
transmitting one or more packets from a buffer in the PDCP context to the relay eNB for providing to the UE.

4. The method of claim 1, wherein the handover procedure relates to handing over the relay eNB from the donor eNB.

5. The method of claim 4, further comprising:
receiving a content of an uplink buffer of a disparate relay eNB communicating with the UE; and
communicating the content of the uplink buffer to the core network.

6. The method of claim 5, further comprising receiving one or more packets from the core network in response to at least a portion of the content of the uplink buffer for providing to the UE.

7. A wireless communications apparatus, comprising: at least one processor configured to: obtain one or more parameters regarding at least one bearer to establish with a core network for communicating with a user equipment (UE) from a donor evolved Node B (eNB) as part of a handover procedure; activate the at least one bearer with the core network; obtain one or more disparate parameters during the handover procedure regarding at least one radio bearer to establish for communicating with the UE from the donor eNB; communicate a request to establish the at least one radio bearer to a relay eNB based at least in part on the one or more disparate parameters; obtain a packet from the core network over the at least one bearer; and communicate the packet to the relay eNB for providing to the UE; and a memory coupled to the at least one processor.

8. The wireless communications apparatus of claim 7, wherein the at least one processor is further configured to identify the at least one radio bearer in the packet.

9. The wireless communications apparatus of claim 8, wherein the at least one processor is further configured to:
obtain a packet data convergence protocol (PDCP) context from the donor eNB related to communicating with the UE; and
provide one or more packets from a buffer in the PDCP context to the relay eNB for transmitting to the UE.

10. The wireless communications apparatus of claim 7, wherein the at least one processor is further configured to:
obtain contents of an uplink buffer of a disparate relay eNB communicating with the UE; and
communicate the contents of the uplink buffer to the core network, wherein the handover procedure relates to handing over the relay eNB from the donor eNB.

11. The wireless communications apparatus of claim 10, wherein the at least one processor is further configured to receive one or more packets from the core network in response to at least a portion of the contents of the uplink buffer for providing to the UE.

12. An apparatus, comprising:
means for receiving one or more parameters regarding at least one bearer to establish with a core network for communicating with a user equipment (UE) from a donor evolved Node B (eNB) as part of a handover procedure;
means for establishing the at least one bearer with the core network;
means for receiving a packet from the core network over the at least one bearer; and
means for communicating the packet to a relay eNB for providing to the UE,
wherein the means for receiving the one or more parameters further receives one or more disparate parameters related to at least one radio bearer to establish for communicating with the UE from the donor eNB as part of the handover procedure, and the means for establishing the at least one bearer communicates a request to establish the at least one radio bearer to the relay eNB based at least in part on the one or more disparate parameters.

13. The apparatus of claim 12, further comprising means for obtaining a packet data convergence protocol (PDCP) context from the donor eNB related to communicating with the UE, wherein the means for communicating further communicates one or more packets from a buffer in the PDCP context to the relay eNB for transmitting to the UE.

14. The apparatus of claim 12, further comprising means for receiving a content of an uplink buffer of a disparate relay eNB, wherein the means for establishing the at least one bearer with the core network further communicates the content of the uplink buffer to the core network.

15. A computer program product, comprising:
a non-transitory computer-readable medium comprising:
code for causing at least one computer to obtain one or more parameters regarding at least one bearer to establish with a core network for communicating with a user equipment (UE) from a donor evolved Node B (eNB) as part of a handover procedure;
code for causing the at least one computer to activate the at least one bearer with the core network;
code for causing the at least one computer to obtain one or more disparate parameters during the handover procedure regarding at least one radio bearer to establish for communicating with the UE from the donor eNB; and
code for causing the at least one computer to communicate a request to establish the at least one radio bearer to a relay eNB based at least in part on the one or more disparate parameters;
code for causing the at least one computer to obtain a packet from the core network over the at least one bearer; and
code for causing the at least one computer to communicate the packet to the relay eNB for providing to the UE.

16. The computer program product of claim 15, wherein the non-transitory computer-readable medium further comprises code for causing the at least one computer to identify the at least one radio bearer in the packet.

17. The computer program product of claim 16, wherein the non-transitory computer-readable medium further comprises:
code for causing the at least one computer to obtain a packet data convergence protocol (PDCP) context from the donor eNB related to communicating with the UE; and
code for causing the at least one computer to provide one or more packets from a buffer in the PDCP context to the relay eNB for transmitting to the UE.

18. The computer program product of claim 15, wherein the non-transitory computer-readable medium further comprises:
code for causing the at least one computer to obtain contents of an uplink buffer of a disparate relay eNB communicating with the UE; and
code for causing the at least one computer to communicate the contents of the uplink buffer to the core network, wherein the handover procedure relates to handing over the relay eNB from the donor eNB.

19. The computer program product of claim 18, wherein the non-transitory computer-readable medium further comprises code for causing the at least one computer to receive one or more packets from the core network in response to at least a portion of the contents of the uplink buffer for providing to the UE.

20. An apparatus, comprising:
a bearer information receiving component that obtains one or more parameters regarding at least one bearer to establish with a core network for communicating with a user equipment (UE) from a donor evolved Node B (eNB) as part of a handover procedure;
a bearer establishment requesting component that activates the at least one bearer with the core network;
a backhaul link component that receives a packet from the core network over the at least one bearer; and
a packet routing component that communicates the packet to a relay eNB for providing to the UE,
wherein the bearer information receiving component further receives one or more disparate parameters related to at least one radio bearer to establish for communicating with the UE from the donor eNB as part of the handover procedure, and the bearer establishment requesting component communicates a request to establish the at least one radio bearer to the relay eNB based at least in part on the one or more disparate parameters.

21. The apparatus of claim 20, further comprising a packet data convergence protocol (PDCP) parameter receiving component that obtains a PDCP context from the donor eNB related to communicating with the UE, wherein the packet routing component further communicates one or more packets from a buffer in the PDCP context to the relay eNB for transmitting to the UE.

22. The apparatus of claim 20, further comprising an uplink buffer contents receiving component that obtains contents of an uplink buffer of a disparate relay eNB, wherein the backhaul link component communicates the contents of the uplink buffer to the core network.

23. The apparatus of claim 22, wherein the backhaul link component receives one or more packets from the core network in response to at least a portion of the contents of the uplink buffer for providing to the UE.

* * * * *